(12) United States Patent
Rich et al.

(10) Patent No.: US 7,124,071 B2
(45) Date of Patent: Oct. 17, 2006

(54) PARTITIONING A MODEL INTO A PLURALITY OF INDEPENDENT PARTITIONS TO BE PROCESSED WITHIN A DISTRIBUTED ENVIRONMENT

(75) Inventors: Marvin J Rich, Poughkeepsie, NY (US); William K Mellors, Clinton Corners, NY (US); Soon I. Joe, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 837 days.

(21) Appl. No.: 10/125,217

(22) Filed: Apr. 18, 2002

(65) Prior Publication Data

US 2003/0200073 A1    Oct. 23, 2003

(51) Int. Cl.
*G06F 17/50* (2006.01)
(52) U.S. Cl. ....................................................... 703/16
(58) Field of Classification Search .................. 326/93; 370/218, 392; 702/60; 703/13–17, 20, 22, 703/23, 27; 709/248; 714/33, 38; 716/1–18; 717/141, 149
See application file for complete search history.

(56) References Cited

U.S. PATENT DOCUMENTS

| 4,914,612 | A |  | 4/1990 | Beece et al. ................. 703/15 |
| 5,146,460 | A |  | 9/1992 | Ackerman et al. ............ 714/33 |
| 5,247,650 | A |  | 9/1993 | Judd et al. .................... 703/20 |
| 5,475,830 | A | * | 12/1995 | Chen et al. ................... 716/16 |
| 5,519,848 | A |  | 5/1996 | Wloka et al. ................. 703/13 |
| 5,673,199 | A |  | 9/1997 | Gentry ........................... 703/1 |
| 5,862,361 | A |  | 1/1999 | Jain ............................. 703/16 |
| 6,108,494 | A |  | 8/2000 | Eisenhofer et al. .......... 703/14 |
| 6,110,217 | A |  | 8/2000 | Kazmierski et al. ......... 703/14 |
| 6,339,836 | B1 | * | 1/2002 | Eisenhofer et al. ........... 716/5 |

OTHER PUBLICATIONS

Manjikian and Loucks; "High Performance Parallel Logic Simulation on a Network of Workstations", Proc. 7th Workshop on Parallel and Distributed Simulation (PADS), vol. 23, No. 1, pp. 76-84, 1993.*
Casas et al.; "Logic Verification Of Very Large Circuits Using Shark"; VLSI Design, 1999. Proceedings. Twelfth International Conference on Jan. 7-10, 1999 pp. 310-317.*
"Distributed Simulation for Structural VHDL Netlists", W. van Almsick, W. Daehn, D. Bernstein, European Design Automation Conference with Euro-VHDL '94, Sep. 19-23, 1994, pp. 598-603.
"Partitioning of VHDL Models For A Distributed Simulation In A Workstation Cluster", M. Koch, D. Tavangarian, Systems Analysis Modelling Simulation, Jun. 26-30, 1995, pp. 595-598.

(Continued)

*Primary Examiner*—Paul L. Rodriguez
*Assistant Examiner*—Juan Carlos Ochoa
(74) *Attorney, Agent, or Firm*—John E. Campbell; Blanche E. Schiller, Esq.; Heslin Rothenberg Farley & Mesiti P.C.

(57) ABSTRACT

A model is partitioned into a plurality of partitions to be processed by a selected number of processors. Since the partitions are substantially independent of one another, the policy employed in the mapping of the partitions to the processors is flexible. Further, in the case in which the model is a chip, at least a portion of the clock and maintenance logic of the chip is also partitioned and mapped to the selected number of processors.

86 Claims, 21 Drawing Sheets

OTHER PUBLICATIONS

"Coupled Distributed Parallel Simulation", IBM Technical Disclosure Bulletin, L.J. Cesa, T.E. Rosser, vol. 34, No. 10A, Mar. 1992, pp. 273-277.

"Hardware Description Language Modeling For Analog-Digital Hardware Designs", IBM Technical Disclosure Bulletin, M.W. Brown, B. R. Stanisic, vol. 33, No. 6A, Nov. 1990, pp. 112-116.

* cited by examiner

PARTITIONING A MODEL INTO A PLURALITY OF INDEPENDENT PARTITIONS TO BE PROCESSED WITHIN A DISTRIBUTED ENVIRONMENT

BACKGROUND OF THE INVENTION

Model simulation provides a mechanism by which the design of a component (e.g., the design of a hardware chip) can be tested prior to building the component. This testing is to ensure that the component, once built, will meet the desired specifications of the component. The component is tested by creating a model of the component and simulating the model. There are various types of model simulation, including event simulation and cycle simulation. Event simulation takes into account delays within the component (e.g., hardware delays), whereas cycle simulation ignores such delays.

Pervasive in the industry today are problems with simulating large and/or complex models. For example, there are problems associated with simulating the functionality of a complex Application Specific Integrated Chip (ASIC) using event simulation. In particular, as chip densities have increased, the performance of the simulation has degraded. That is, event simulators have experienced a non-linear increase in processing time, as the number of events have increased. Thus, as technology advances have steadily increased chip densities and more function has been placed on a chip (i.e., System On Chip (SOC)), an explosion in the number of events per cycle has been realized, as well as an increase in the simulation model size required to simulate a chip as a single entity.

Therefore, a need exists for a capability that facilitates simulation of these models. In particular, a need exists for a capability that enables the simulation of a model, such as the functionality of a chip, without degrading simulation performance. A need exists for a capability that enables the simulation of models within a distributed computing environment.

SUMMARY OF THE INVENTION

The shortcomings of the prior art are overcome and additional advantages are provided through the provision of a method of partitioning a model. The method includes, for instance, obtaining a model of an arbitrary size; and automatically partitioning, without user directive, the model into a plurality of partitions to be distributed across an arbitrary number of processors.

In one embodiment, the method further includes partitioning other logic associated with the model into at least one of a plurality of logic partitions and a common set of logic to be assigned to at least a plurality of processors of the arbitrary number of processors.

In a further aspect of the invention, a method of partitioning a chip is provided. The method includes, for instance, partitioning functionality of a chip of an arbitrary size into multiple cones of logic; combining the multiple cones of logic into a plurality of partitions, wherein the plurality of partitions are provided without user directive; and mapping the plurality of partitions to an arbitrary number of processors.

System and computer program products corresponding to the above-summarized methods are also described and claimed herein.

A capability is provided that facilitates the simulation of complex models, such as hardware logic chips with large densities. In one example, the capability facilitates the simulation by partitioning the model into a plurality of partitions that can be processed on an arbitrary set of distributed processors. Thus, each processor simultaneously processes a much smaller set of events, corresponding to a subset of the chip, which is also much smaller in size, thereby increasing simulation performance.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

In accordance with an aspect of the present invention, a model is partitioned into a plurality of independent partitions (or submodels) that can be executed on an arbitrary number of processors within a distributed computing environment. This enables the model to be efficiently simulated within the distributed environment via, for instance, event simulation.

Figure 1:
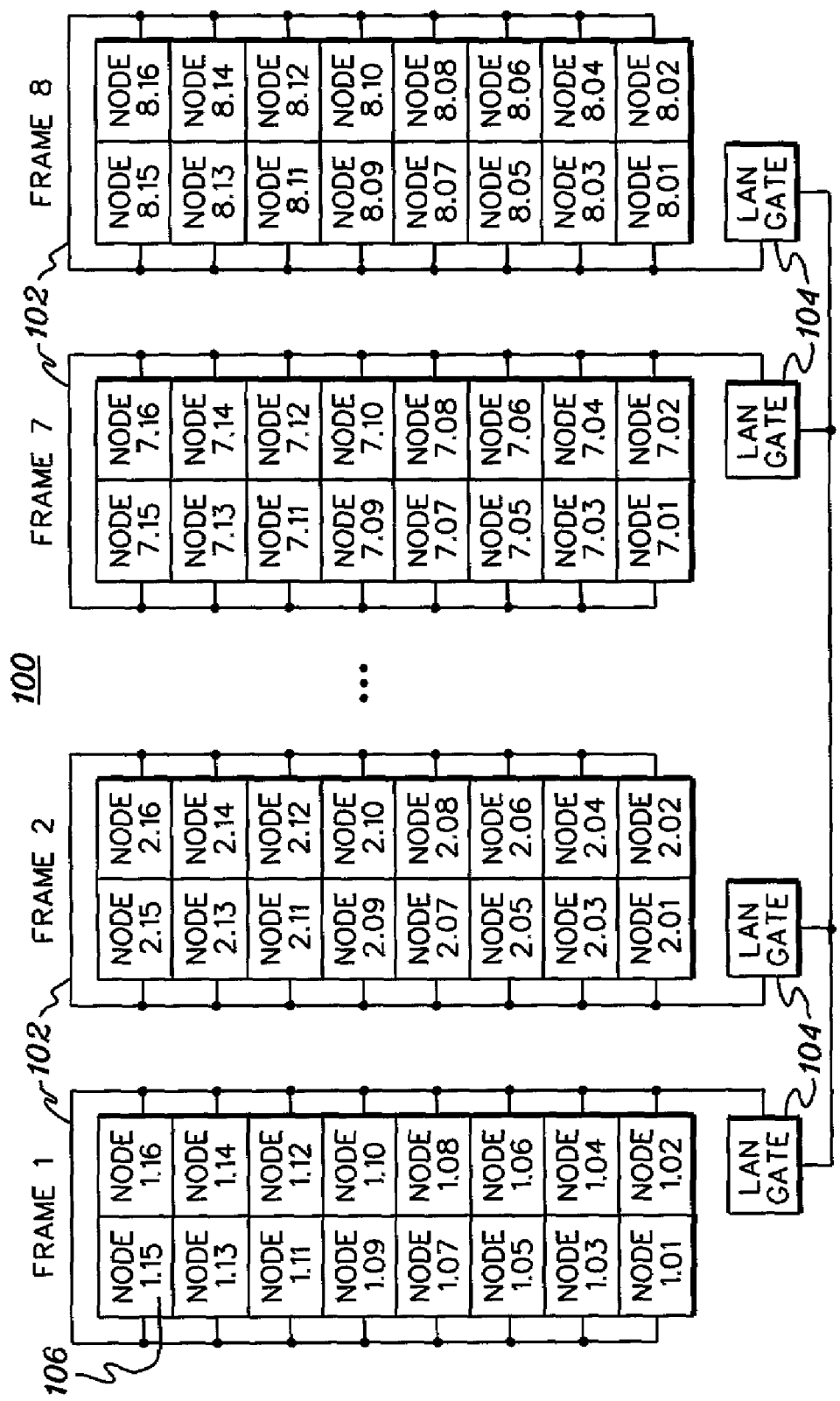
FIG. 1 depicts one embodiment of a distributed computing environment incorporating and using one or more aspects of the present invention.

One embodiment of a distributed computing environment incorporating and using one or more aspects of the present invention is depicted in FIG. 1. In one example, distributed computing environment 100 includes, for instance, a plurality of frames 102 coupled to one another via a plurality of LAN gates 104, each of which is described below.

In one example, distributed computing environment 100 includes eight (8) frames, each of which includes a plurality of processors 106 (a.k.a., processing nodes). In one instance, each frame includes sixteen (16) processors, and each processor is, for instance, a RISC/6000 computer running AIX, a UNIX based operating system. Each processor within a frame is coupled to the other processors of the frame via, for example, an internal LAN connection. Additionally, each frame is coupled to the other frames via LAN gates 104.

As examples, each LAN gate 104 includes either a RISC/6000 computer, any computer network connection to the LAN, or a network router. However, these are only examples. It will be apparent to those skilled in the relevant art that there are other types of LAN gates, and that other mechanisms can also be used to couple the frames to one another.

In addition to the above, the distributed computing environment of FIG. 1 is only one example. It is possible to have more or less than eight frames, or more or less than sixteen nodes per frame. Further, the processors do not have to be RISC/6000 computers running AIX. Some or all of the processors can include different types of computers and/or different operating systems. All of these variations are considered a part of the claimed invention.

A plurality of the processors of the distributed computing environment are used, in accordance with an aspect of the present invention, to run a simulation of a model to verify whether the design of the model satisfies its design specifications. In the particular example described herein, the model represents the functionality of a chip; however, aspects of the invention are not limited to such a model type. One or more aspects of the present invention can be employed to simulate other types of models, such as processes, etc.

Figure 2:
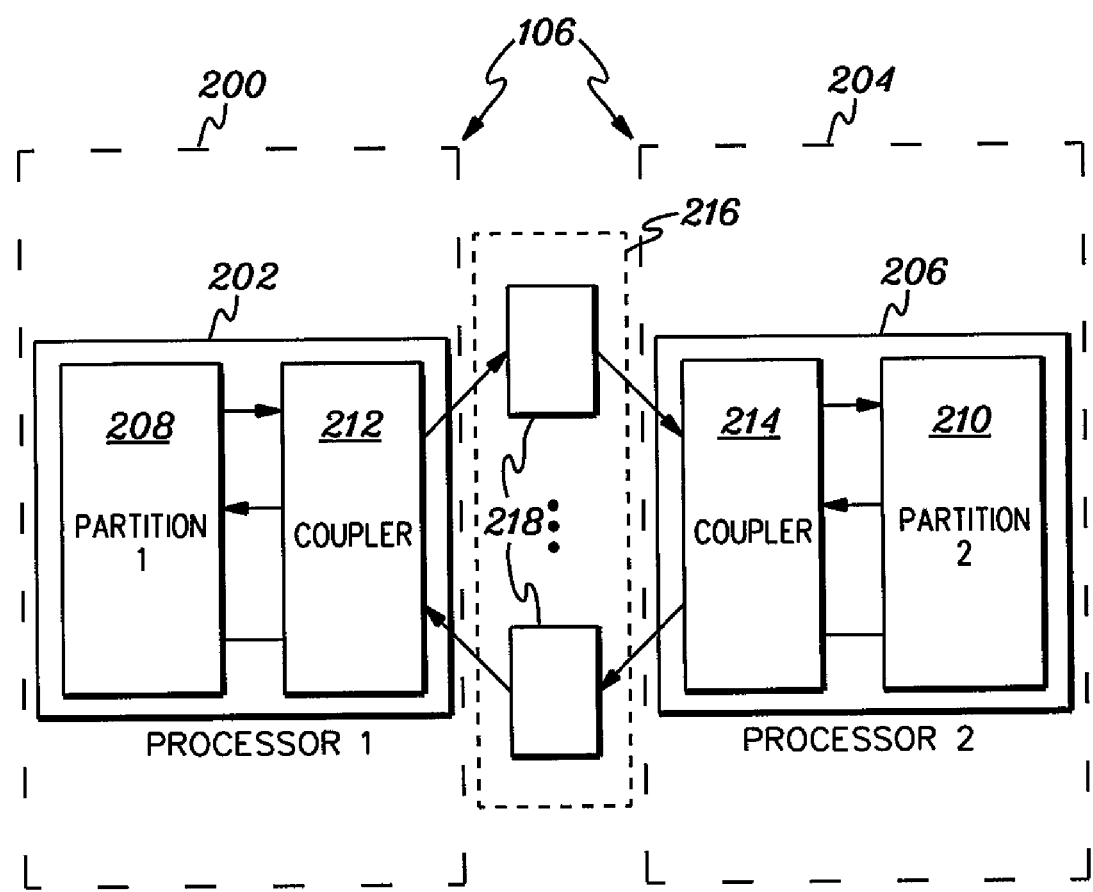
FIG. 2 depicts one example of a plurality of simulators executing on a plurality of the processors of FIG. 1, in accordance with an aspect of the present invention.

Each processor 106 of the distributed computing environment to run the simulation includes a simulator. For instance, as depicted in FIG. 2, processor 200 executes an instance of a licensed hardware simulator 202, and another processor 204 executes an instance of a licensed hardware simulator 206. Although two processors having simulators are depicted, it is understood that any number of the processors within the environment may execute simulators.

In one embodiment, instances 202 and 206 are instances of different licensed hardware simulators, such as VSIM, offered by Model Technology Inc. of Portland, Oreg., and PSIM, offered by International Business Machines Corporation, Armonk, N.Y. In another embodiment, however, instances 202 and 206 may be instances of the same licensed hardware simulator.

The simulators used for one or more aspects of the present invention are event simulators; although, other simulators may be used. Event simulators can accurately model the operation of a wide variety of logic design styles (e.g., synchronous, asynchronous, self-timed) that can exist in a particular design. In one example, the event simulators implement the Institute of Electrical and Electronics Engineers (IEEE) Very High Speed Integrated Circuits (VHSIC) Hardware Description Language (VHDL) Initiative Towards ASIC Libraries (VITAL) standard, which provides a capability to back annotate timing delays onto technology gate models in VHDL.

In accordance with an aspect of the present invention, at least one simulator includes logic to partition a model into a plurality of partitions, which are then processed on a plurality of processors by the simulators associated with those processors. For example, instance 202 processes a partition 208, and instance 206 processes a partition 210.

In one embodiment, the partitions are coupled to one another via couplers and a communications medium. For instance, partition 208 is coupled to a coupler 212 and partition 210 is coupled to a coupler 214. The couplers communicate with one another via a communications medium 216.

The communications medium includes, for instance, a storage device using the Andrew File System (AFS), offered by International Business Machines Corporation, Armonk, N.Y. AFS is a distributed file system that enables the cooperating host to efficiently share file system resources across both local area and wide area networks. In one example, the storage device includes a common communication directory (CCD). The CCD includes a plurality of files 218, which are read and write accessible by couplers 212 and 214. The plurality of files 218 are used to transmit data between partitions 208 and 210 via couplers 212 and 214. Further details of the communication between partitions is described in a co-filed U.S. patent application, entitled "COUPLER INTERFACE FOR FACILITATING DISTRIBUTED SIMULATION OF A PARTITIONED LOGIC DESIGN", Mellors et al., which is hereby incorporated herein by reference in its entirety.

Figure 3A:
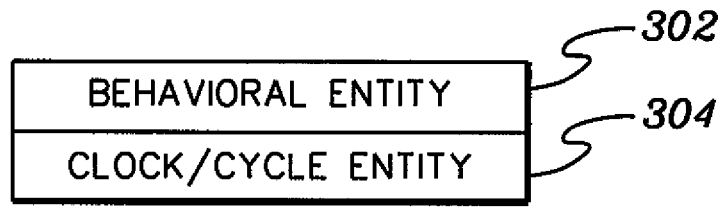
FIG. 3a depicts one embodiment of various entities of a model to be partitioned, in accordance with an aspect of the present invention.

A model includes a plurality of entities, and thus, in partitioning the model, each of the model's entities may be partitioned. In one example, a model 300 (FIG. 3A) includes a behavioral entity 302 and a clock/cycle entity 304. Clock/cycle entity 304 determines when elements of behavioral entity 302 can change.

For a model that represents an ASIC chip design, the behavioral components include, for instance, latches, gates and/or wires; and the clock/cycle entity includes, for instance, a clock waveform value on clock distribution wires. Behavioral elements take on new values and launch new values based on cycles of the clock waveform. Clock events, such as waveform rises, are utilized by event-driven applications; whereas cycle-driven applications utilize clock/cycle transitions.

A model may be represented by a netlist and/or VHDL, which is a standard (e.g., VHDL-1076) developed by IEEE. The netlist includes, for example, instances of the logic gates (e.g., latches and combinatorial), along with input and output nets for each gate, such that gate connections are defined (e.g., common net name from Gate A output to Gate B input, as one example). Any logic related to clocks also appear in the netlist, as gates with connecting nets.

Figure 3B:
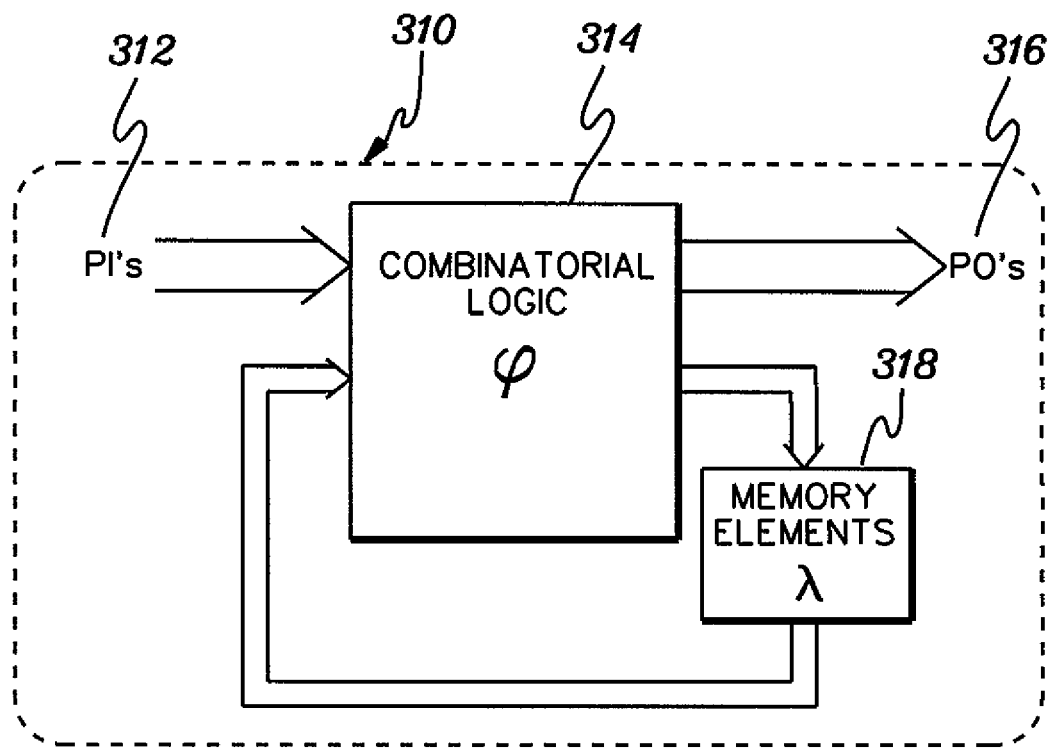
FIG. 3b depicts a Meeley state machine representation of a model to be partitioned, in accordance with an aspect of the present invention.

A model may also be represented by a Meeley state machine, such as the one depicted in FIG. 3b. As shown in FIG. 3b, the Meeley state machine representation of a model 310 includes, for instance, one or more primary inputs 312 to combinatorial logic 314 (e.g., AND, OR gates); one or more primary outputs 316 of the combinatorial logic; and one or more memory elements 318 (e.g., sequential logic, such as latches). The memory elements typically have a clock associated therewith. Further, the memory elements provide the state of the model. In particular, the memory elements remember certain status, which is fed back into the combinatorial logic. Then, based on the combinatorial logic and primary inputs, primary outputs are provided, which represent functions of the model.

In accordance with an aspect of the present invention, in order to efficiently simulate a model, the model is partitioned into a plurality of sub-models or partitions, and then, each of the partitions is assigned to a processor to be executed. The partitioning is performed automatically and does not require user directives of where or how to partition. Further, the partitions can be run on an arbitrary set of target processors. The partitioning is independent of the number of processors. This enables the selection of the number of target processors to be flexible and allows various policies to be used in mapping the partitions to the processors.

An overview of one embodiment of the logic associated with partitioning a model into a plurality of partitions is described with reference to FIG. 4. The examples described herein relate to the partitioning of a chip (e.g., a complex and/or large ASIC hardware chip); however, one or more aspects of the present invention are applicable to the partitioning of other models, as well, and therefore, are not limited to the partitioning of a chip.

Figure 4:
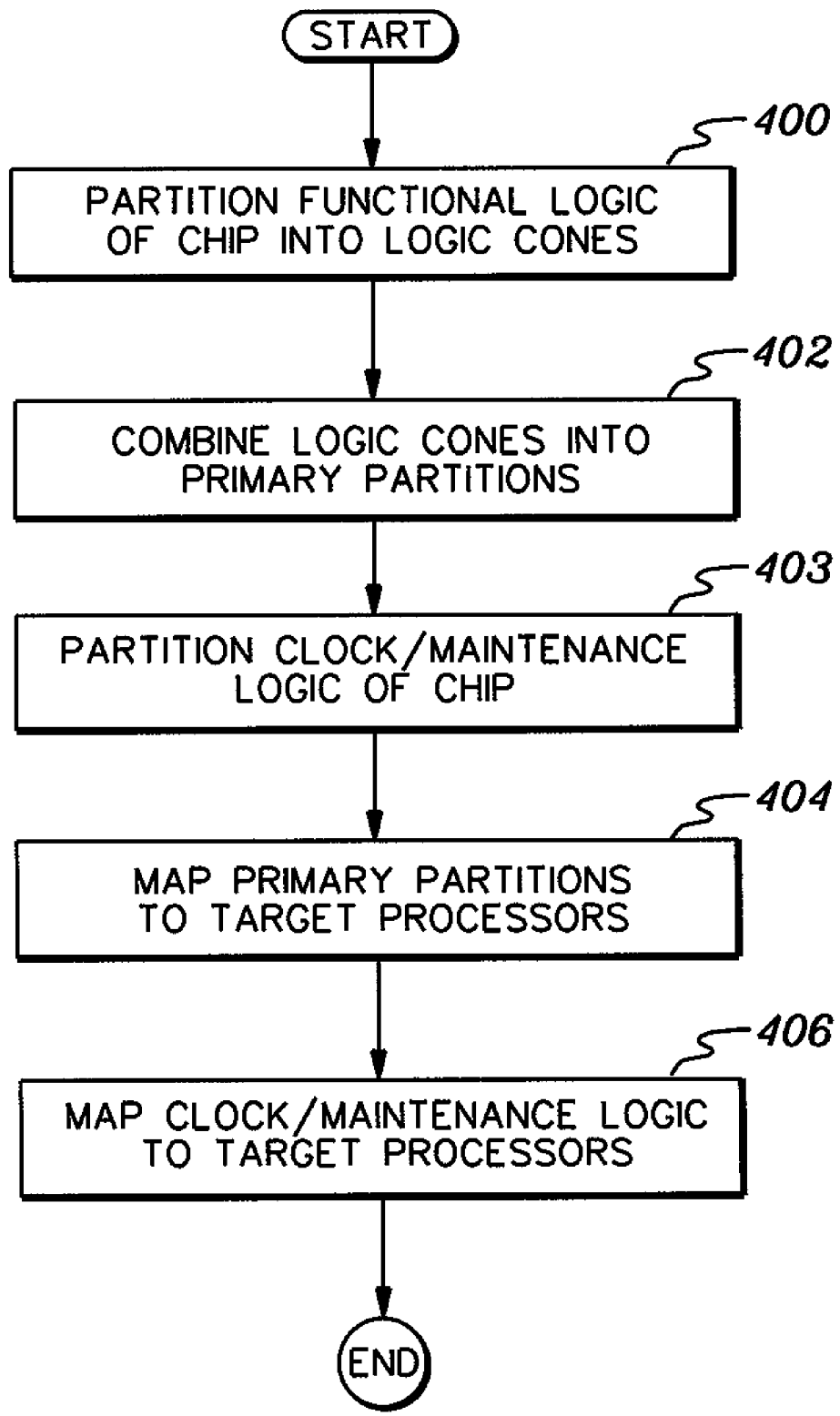
FIG. 4 depicts one embodiment of the logic used to partition a model into a plurality of partitions, in accordance with an aspect of the present invention.

Referring to FIG. 4, when a model (e.g., a chip) to be partitioned is obtained (e.g., provided, received, created, have), an initial step in the partitioning of that chip includes partitioning the functional logic of the chip, which corresponds to the data pins, into a plurality of logic units, such as a plurality of cones of logic, STEP 400. Each cone of logic includes one memory element (e.g., a latch) and the combinatorial logic associated with that memory element, if any. The partitioning of the functional logic of the chip produces one or more latch ids (latch_IDs) for the one or more latches of the chip, as described in further detail below.

Thereafter, the cones of logic are combined into a plurality of primary partitions, STEP 402. A primary partition may include one or more cones of logic. For example, a primary partition may include only one cone of logic, if that cone of logic does not intersect with any other cones of logic; or it may include multiple cones of logic, if that cone of logic intersects with one or more other cones of logic.

Subsequent to determining the primary partitions for the functional logic of the chip, other logic of the chip, if any, such as clock/maintenance logic (which corresponds to clock pins), is partitioned to determine the clock/maintenance logic associated with the primary partitions, STEP 403. The partitioning of the clock/maintenance logic associates each gate or latch of the clock/maintenance logic to a set of one or more functional latches, by placing an appropriate Latch_ID value in a separate CLK_ID field. This information can then be used to derive the clock/maintenance logic associated with a primary partition. In one example, each latch may have one or more clocks driving the latch.

After associating the clock/maintenance logic with the primary partitions, the primary partitions are mapped to an arbitrary set of target processors, STEP 404. The policy used for this mapping can be selected irrespective of the partitioning. Additionally, the number of processors selected is independent of the partitioning, and can vary with each simulation.

Thereafter, the other logic of the chip, such as the clock and maintenance logic, is mapped to the target processors, STEP 406.

Further details regarding the partitioning of a chip into a plurality of partitions are described with reference to FIGS. 5–18. In particular, the partitioning of the chip into cones of logic is described with reference to FIGS. 5–8; the combining of the cones of logic into primary partitions is described with reference to FIGS. 9–11; the partitioning of other logic of the chip, such as the clock/maintenance logic, is described with reference to FIGS. 12a–13; the mapping of the primary partitions to target processors is described with reference to FIGS. 14–15; the mapping of the clock and maintenance logic of the chip to target processors is described with reference to FIGS. 16–17b; and a resultant partitioned chip is depicted in FIG. 18.

Figure 5:
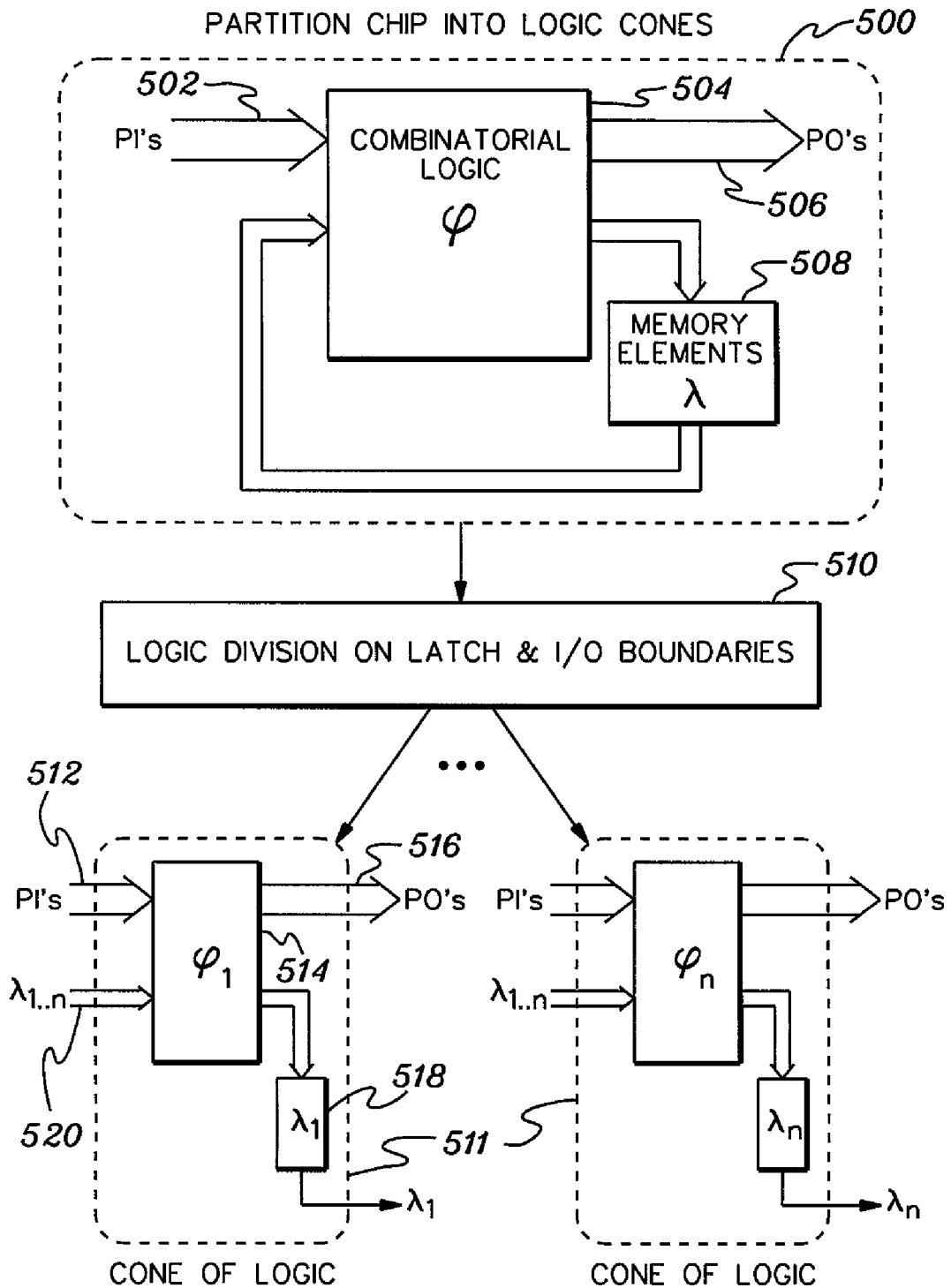
FIG. 5 is a pictorial illustration of one step of the partitioning logic of FIG. 4, which includes partitioning the model into a plurality of cones of logic, in accordance with an aspect of the present invention.

Referring initially to FIG. 5, a chip 500 is to be partitioned. The chip is represented by a Meeley state machine having primary inputs 502, combinatorial logic 504, primary outputs 506, and memory elements 508. An initial step of the partitioning is to partition the functionality of chip 500, using logic division on latch and I/O boundaries 510, into a plurality of cones of logic 511.

Each cone of logic may also be represented by a Meeley state machine. Thus, each cone of logic includes, for instance, one or more primary inputs 512; a set of combinatorial logic 514, if any, unique to the cone of logic; one or more primary outputs 516; a memory element 518, such as a single latch that starts the cone of logic; and one or more input memory elements 520 that are inputs from other cones of logic. Memory element 518 may be one of the elements included in input memory elements 520.

Figure 6:
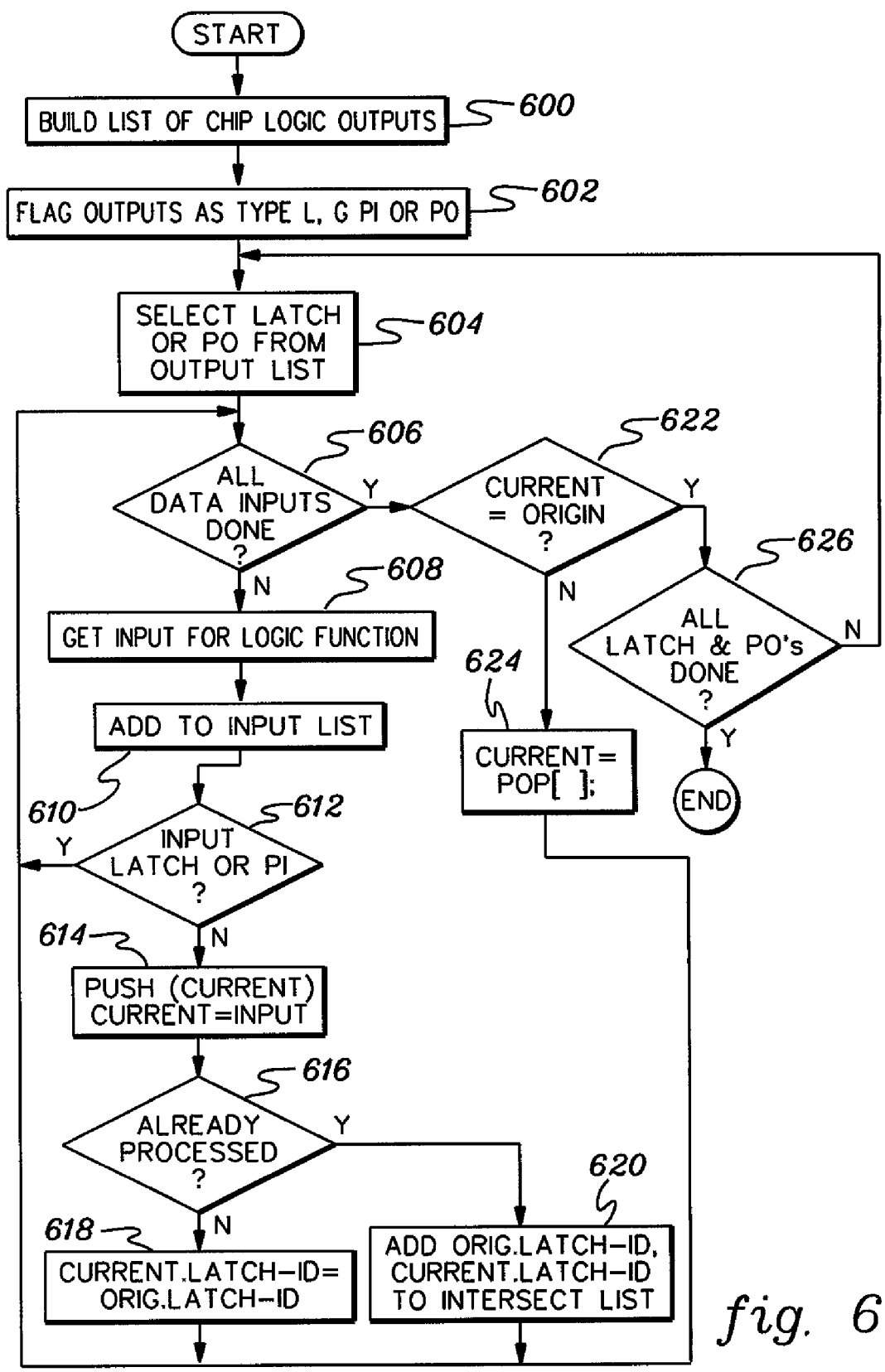
FIG. 6 depicts one embodiment of the logic associated with partitioning the model into the plurality of cones of logic, in accordance with an aspect of the present invention.

One embodiment of the logic associated with partitioning a chip into a plurality of cones of logic is described with reference to FIG. 6. Initially, a list of chip logic outputs is built, STEP 600. In one example, this output list is generated from the netlist associated with the chip, which identifies the various logic elements of the chip. One example of an output list 700 is depicted in FIG. 7.

Figure 7:
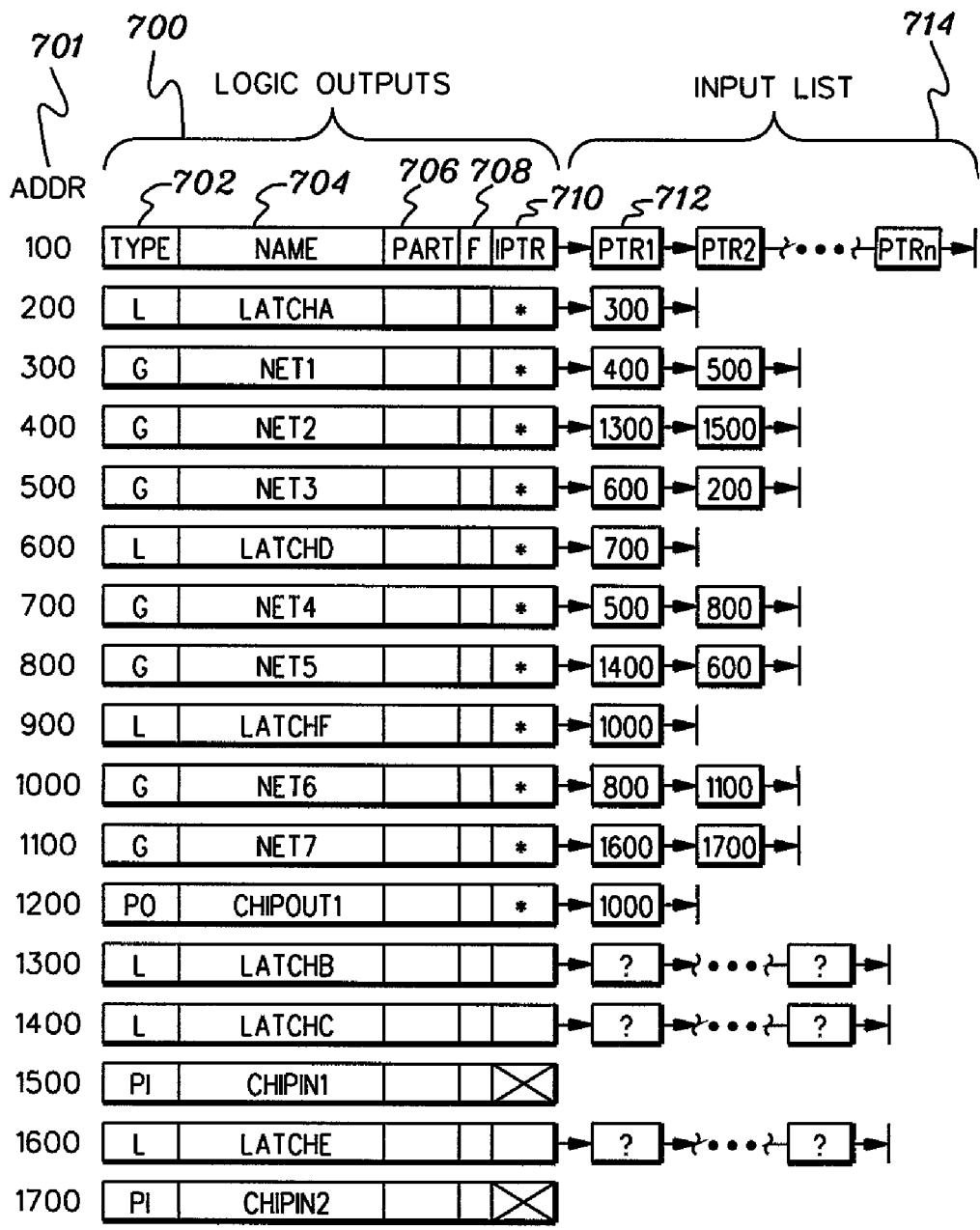
FIG. 7 depicts one embodiment of the logic outputs for a sample portion of a model, and an input list generated in accordance with an aspect of the present invention.
Figure 8:
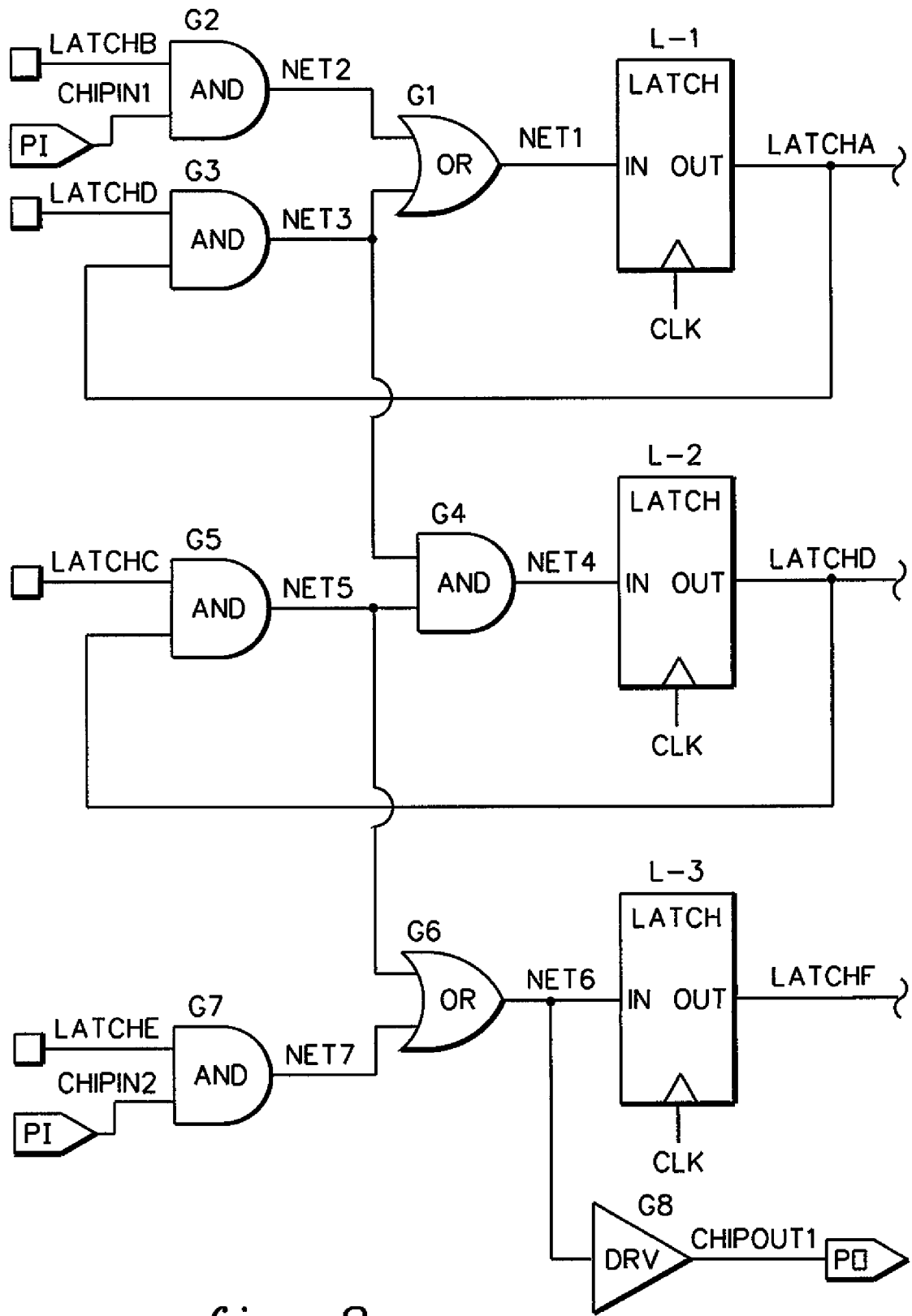
FIG. 8 depicts one embodiment of the combinatorial logic and latches of the sample model portion of FIG. 7, in accordance with an aspect of the present invention.

The output list of FIG. 7 depicts various of the logic outputs for a sample portion of a chip depicted in FIG. 8. As shown, output list 700 includes a plurality of entries, each of which is addressed by an address 701 and each having, for instance, a type field 702 indicating whether the logic element is a latch (L), a gate (G), a primary input (PI), or a primary output (PO); a name field 704 indicating the name of the logic element; a part field 706, which includes partitioning specific information, such as values of variables used in the partitioning; a flag field 708 indicating whether all inputs of the particular logic element have been processed; and a pointer 710, which points to a linked list of pointers 712 of inputs driving the particular element.

Returning to FIG. 6, subsequent to building the output list, the type of each output (e.g., latch, gate, primary input, or primary output) is provided by filling in type field 702, STEP 602.

Next, a latch or primary output is selected from the output list, STEP 604. Additionally, a variable referred to as Current is set equal to the selected output, a variable referred to as Origin is set equal to Current, and a variable referred to as Orig.Latch-Id is initialized to a number, such as one.

Thereafter, a determination is made as to whether all the data inputs for that selected latch or primary output have been processed, INQUIRY 606. For example, assume that Latch A of FIGS. 7 and 8 is selected. Then, a determination is made as to whether the input of Latch A (e.g., Net 1, address 300) has been added to an input list 714 (FIG. 7). Since in this example, no inputs have been processed yet, the input of the selected logic element is obtained (e.g., Net 1), STEP 608, and its address (e.g., 300) is added to input list 714, STEP 610.

Subsequently, a determination is made as to whether the input (e.g., Net 1) is a latch or a PI, INQUIRY 612. If so, then processing continues with INQUIRY 606. However, if the input is not a latch or primary input, then Current is pushed onto a stack, and Current is set to an address of the identified input, STEP 614.

Thereafter, a determination is made as to whether the obtained input has already been processed, INQUIRY 616. For example, a determination is made as to whether a latch id (e.g., Current.Latch-Id) has already been assigned to the input. If the input has not already been processed, INQUIRY 616, then Current.Latch-Id (e.g., 300.Latch-Id) is set equal to Orig.Latch-Id (e.g., 200.Latch-Id), which in this example is one, STEP 618. Processing then continues with INQUIRY 606.

However, if the input has been processed, then it indicates that the current latch or primary output intersects with another latch or primary output. Thus, Orig.Latch-Id, Current.Latch-Id (e.g., 1, 2) is added to an intersect list, STEP 620. The intersect list includes one or more tuples, and each tuple has a latch id (i.e., Orig.Latch-Id) and an intersect id (i.e., Current.Latch-Id). Processing then continues with INQUIRY 606.

At INQUIRY 606, when all the inputs for Current have been processed, then a determination is made as to whether Current is equal to Origin, INQUIRY 622. If Current is not equal to Origin, then Current is set equal to the id popped off of the stack, STEP 624, and processing continues with INQUIRY 606. However, if Current is equal to Origin, then a cone of logic has been completed. The cone of logic includes the latch and any combinatorial logic associated therewith (e.g., LATCH A and combinatorial logic: Net 1, Net 2, Net 3).

Thereafter, a further determination is made as to whether all of the latch and primary outputs have been processed, INQUIRY 626. If not, then processing continues with STEP 604, in which another latch or primary output is selected from the output list. Further, Current is set equal to the selected output, Origin is set equal to Current, and Orig.Latch-Id is incremented by, for instance, one. Otherwise, processing is complete, and the resultant output is a plurality of cones of logic.

Figure 9:
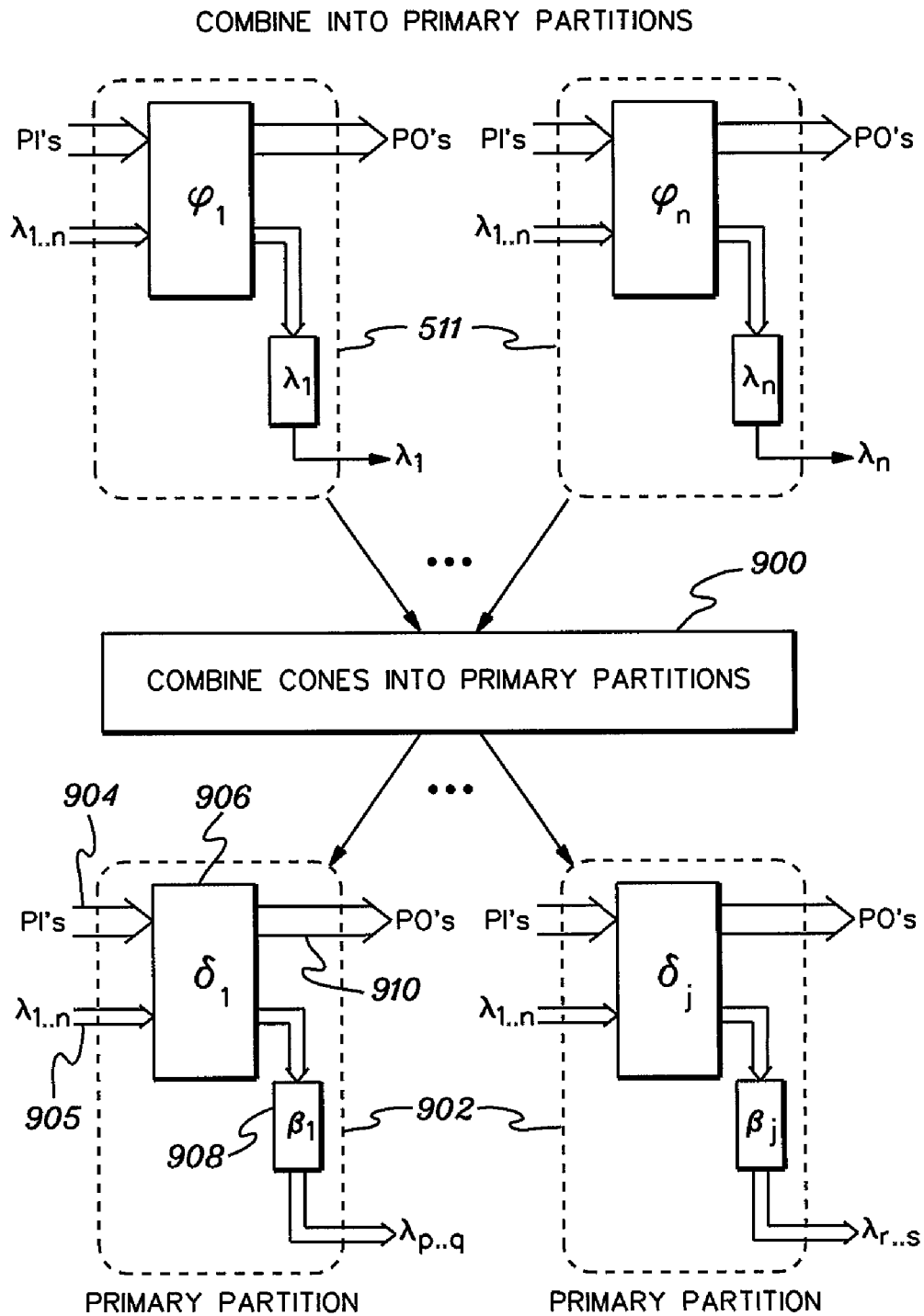
FIG. 9 is a pictorial illustration of combining the plurality of cones of logic of FIG. 5 into a plurality of primary partitions, in accordance with an aspect of the present invention.

Subsequent to obtaining the cones of logic, the cones of logic are combined into a plurality of primary partitions. This is depicted in FIG. 9, in which a plurality of cones of logic 511 are combined using logic 900 into a plurality of primary partitions 902. Each primary partition includes one or more primary inputs 904; one or more input memory elements 905, which are inputs from one or more other primary partitions; a set of intersecting combinatorial logic 906; a set of latches 908 that bound the intersecting combinatorial logic; and one or more primary outputs 910. That is, each primary partition includes one or more cones of logic that intersect (i.e., have shared combinatorial logic). Each primary partition is independent from other primary partitions, in that the combinatorial logic of one primary partition is not needed by another primary partition. Another way of stating this independence is that the combinatorial logic of any primary partition is orthogonal to the combinatorial logic of any other primary partition.

Figure 10:
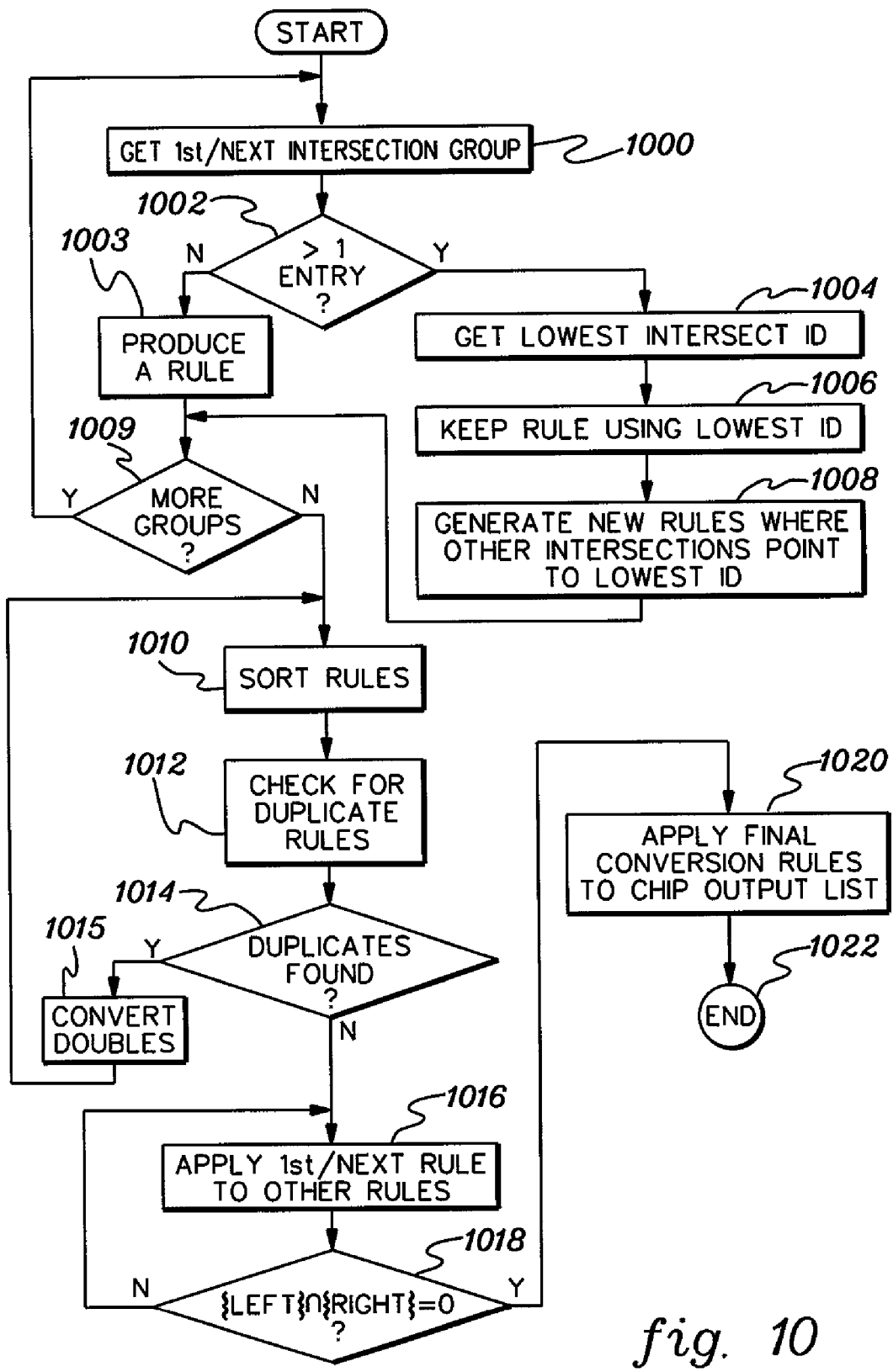
FIG. 10 depicts one embodiment of the logic associated with combining the cones of logic into the primary partitions, in accordance with an aspect of the present invention.
Figure 11:
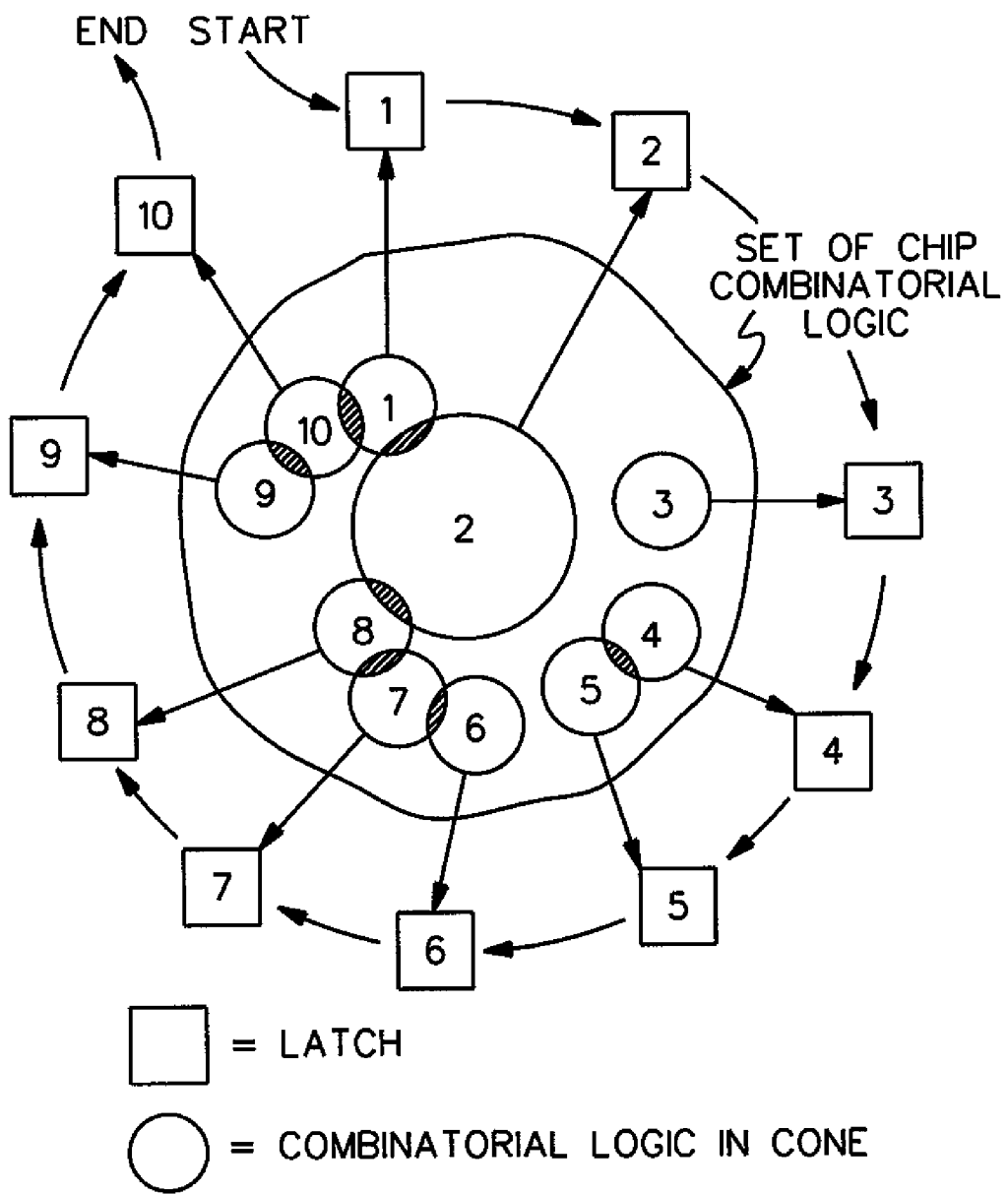
FIG. 11 is an illustration of the intersections of various latches, in accordance with an aspect of the present invention.

One embodiment of the logic associated with combining the cones of logic into primary partitions is described with reference to FIGS. 10–11. Initially, an intersect group is selected, STEP 1000 (FIG. 10). An intersect group includes one or more entries from the intersect list that have the same latch id. For example, assume that a chip has ten latches (latch 1–latch 10). Further, assume that STEP 620 of FIG. 6 produced the following intersect list for that chip, which is pictorially illustrated in FIG. 11:

| Latch Id | Intersect Id |
|---|---|
| 2 | 1 |
| 5 | 4 |
| 7 | 6 |
| 8 | 2 |
| 8 | 7 |
| 10 | 1 |
| 10 | 9 |

Then, a group would include 2,1; another group would include 5,4; . . . ; a further group would include 8,2 and 8,7; etc. Thus, one of the groups is selected.

Subsequent to selecting the intersect group, a determination is made as to whether there is more than one entry in the selected group (i.e., whether the group includes multiple entries with the same latch id), INQUIRY 1002. If the group only has one entry, then a rule is produced for that group, STEP 1003. For example, the first group (e.g., 2,1) only has one entry. Thus, the following rule is produced 2→1. If, however, there is more than one entry, INQUIRY 1002, then a reduction process is performed to obtain a set of one or more primary intersections. In this example, the reduction process looks for the lowest intersect id of the group, STEP 1004, and that lowest id is kept as the rule, STEP 1006. For instance, in the above list, Latch Id 8 intersects with Latch Ids 2 and 7. Thus, the lowest intersect id is 2, and the rule that is kept is 8 intersects with 2 (e.g., 8→2).

Additionally, other rules are generated, in which other intersections indicated by the group also point to the lowest intersect id, STEP 1008. For example, since Latch Id 8 also intersects with Latch Id 7, another rule is generated indicating that Latch Id 7 intersects with Latch Id 2.

After processing a group, either with one or more entries, a determination is made as to whether there are more groups in the intersect list, INQUIRY 1009. If so, then processing continues with STEP 1000. However, if all of the groups have been processed, then a set of rules has been produced for the intersect list. In this example, the set of rules include:

| Rules |
|---|
| 2 -> 1 |
| 5 -> 4 |
| 7 -> 6 |
| 8 -> 2 |
| 7 -> 2 |
| 10 -> 1 |
| 9 -> 1. |

After generating the rules, the rules are sorted, STEP 1010. In one example, the rules are sorted in order of latch id, and secondarily, in order of intersecting id, when there are multiple latch ids of the same value. Thus, for the above example, the rules are sorted, as follows:

| Rules |
|---|
| 2 -> 1 |
| 5 -> 4 |
| 7 -> 2 |
| 7 -> 6 |
| 8 -> 2 |
| 9 -> 1 |
| 10 -> 1. |

Next, a check is made for duplicate rules, STEP 1012. That is, a check is made as to whether there are multiple rules for a particular latch id. For instance, in the above scenario, there are two (2) rules for Latch Id 7. Thus, there is a set of multiple entries, in which each entry of the set has the same latch id.

If duplicates are found, INQUIRY 1014, then processing continues with STEP 1015 in order to remove the duplicates. In one example, the duplicates are removed by performing the following steps for each set of multiples:

Eliminating all entries of the set but one. The entry kept, in this example, is the one with the lowest intersecting id (e.g., 7→2).

Then, the removed entries are converted by taking the intersecting ids of the removed entries, providing them as latch ids and assigning the intersecting id of the remaining entry of the set to the new latch ids. Thus, in the example, 7→6 is converted by taking the 6 of 7→6 for a latch id and assigning the 2 to produce 6→2.

In one embodiment, STEPS 1010, 1012, 1014 and 1015 are repeated until no duplicates are found, since new rules may produce duplicates for lower numbered latch ids.

Once the duplicates are removed, the rules are as follows:

| Latch id | Intersect id |
|---|---|
| 2 -> | 1 |
| 5 -> | 4 |
| 6 -> | 2 |
| 7 -> | 2 |
| 8 -> | 2 |
| 9 -> | 1 |
| 10 -> | 1. |

After converting the duplicates or if no duplicates were found, then a basic set of reduction rules is provided, which is used to generate the primary partitions. This basic set of rules is used to reduce the rules to a primary set, in which there are no intersect ids as latch ids. Thus, if necessary, at least one rule is applied to the other rules until the left and right sides are disjoint, STEP 1016. For example, taking the first rule 2→1, each 2 on the right side is changed to a 1, which produces:

| Rules |
|---|
| 2 -> 1 |
| 5 -> 4 |
| 6 -> 1 |
| 7 -> 1 |
| 8 -> 1 |
| 9 -> 1 |
| 10 -> 1. |

Subsequent to applying a rule, a determination is made as to whether an intersection of the left and right produces a result of zero, INQUIRY 1018. Since, in this example, the left and right sides are disjoint, then no other rules need to be applied. Thus, the final conversion rules may be applied, STEP 1020. However, if the intersection did not produce a zero value, then processing would continue at STEP 1016.

In applying the final conversion rules, each latch of the chip is assigned a rule. For instance, in the above scenario, there are ten latches and each latch is assigned a rule. For example, latch 1 had no conversion, so it is assigned 1, latch 2 is converted to 1, etc., producing the following:

| Latch | Assignment |
|---|---|
| 1 | 1 |
| 2 | 1 |
| 3 | 3 |
| 4 | 3 |
| 5 | 4 |
| 6 | 4 |
| 7 | 1 |
| 8 | 1 |
| 9 | 1 |
| 10 | 1 |

Thus, there are three (3) unique assignments (e.g., 1, 3 and 4), which represent three (3) primary partitions, STEP 1022. Each primary partition is assigned, in this example, the value of the lowest latch of the partition (e.g., 1, 3, 4).

Subsequent to obtaining primary partitions 902, the clock and maintenance logic associated with the primary partitions is determined. One embodiment of the logic associated with partitioning the clock and maintenance logic is described with reference to FIGS. 12a–12c. Further, one embodiment of a sample portion of clock and maintenance logic to be partitioned is depicted in FIG. 13.

Figure 12A:
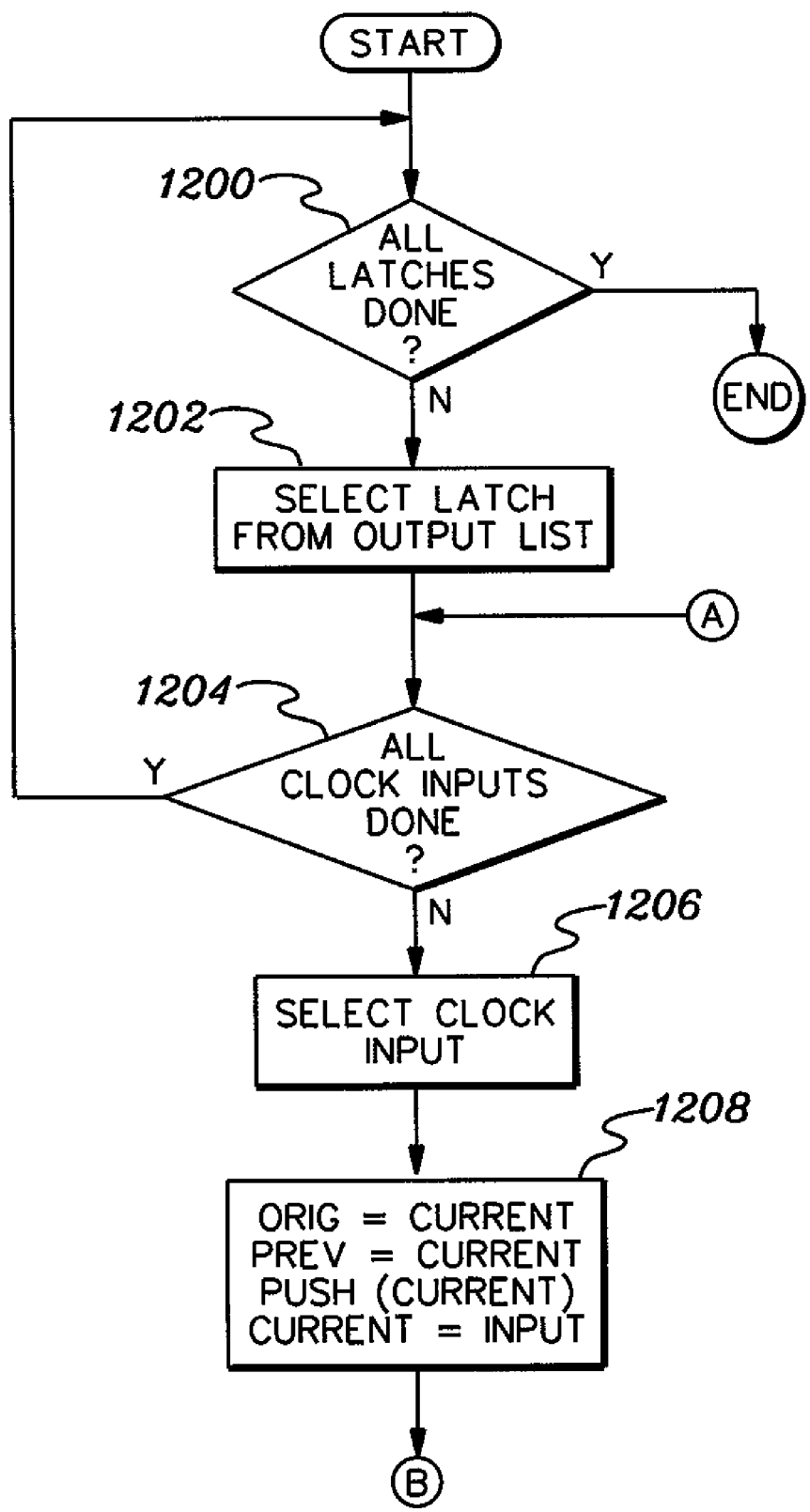
FIGS. 12a–12c depict one embodiment of the logic associated with partitioning the clock and maintenance logic of a model, in accordance with an aspect of the present invention.
Figure 12B:
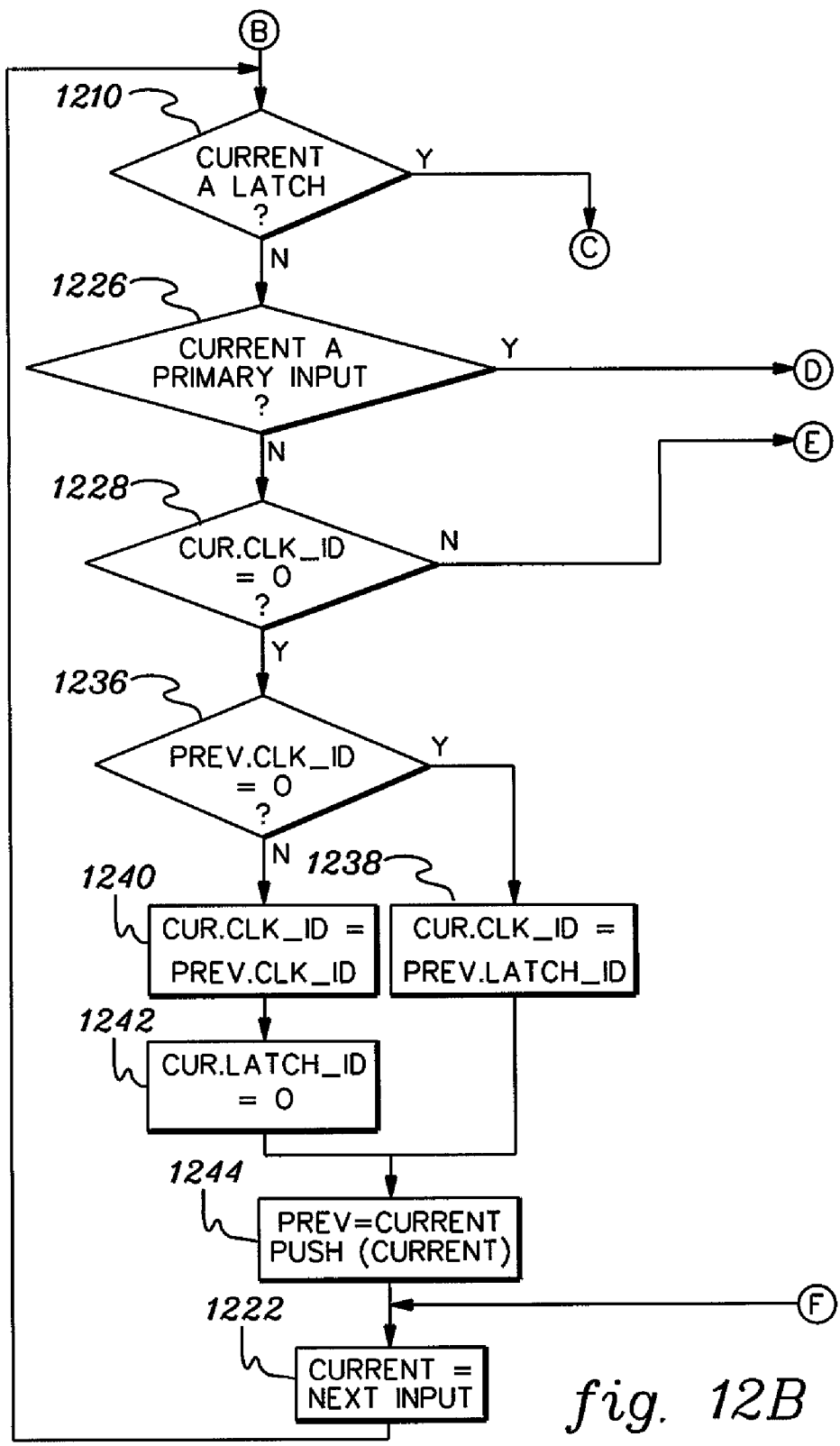
Figure 12C:
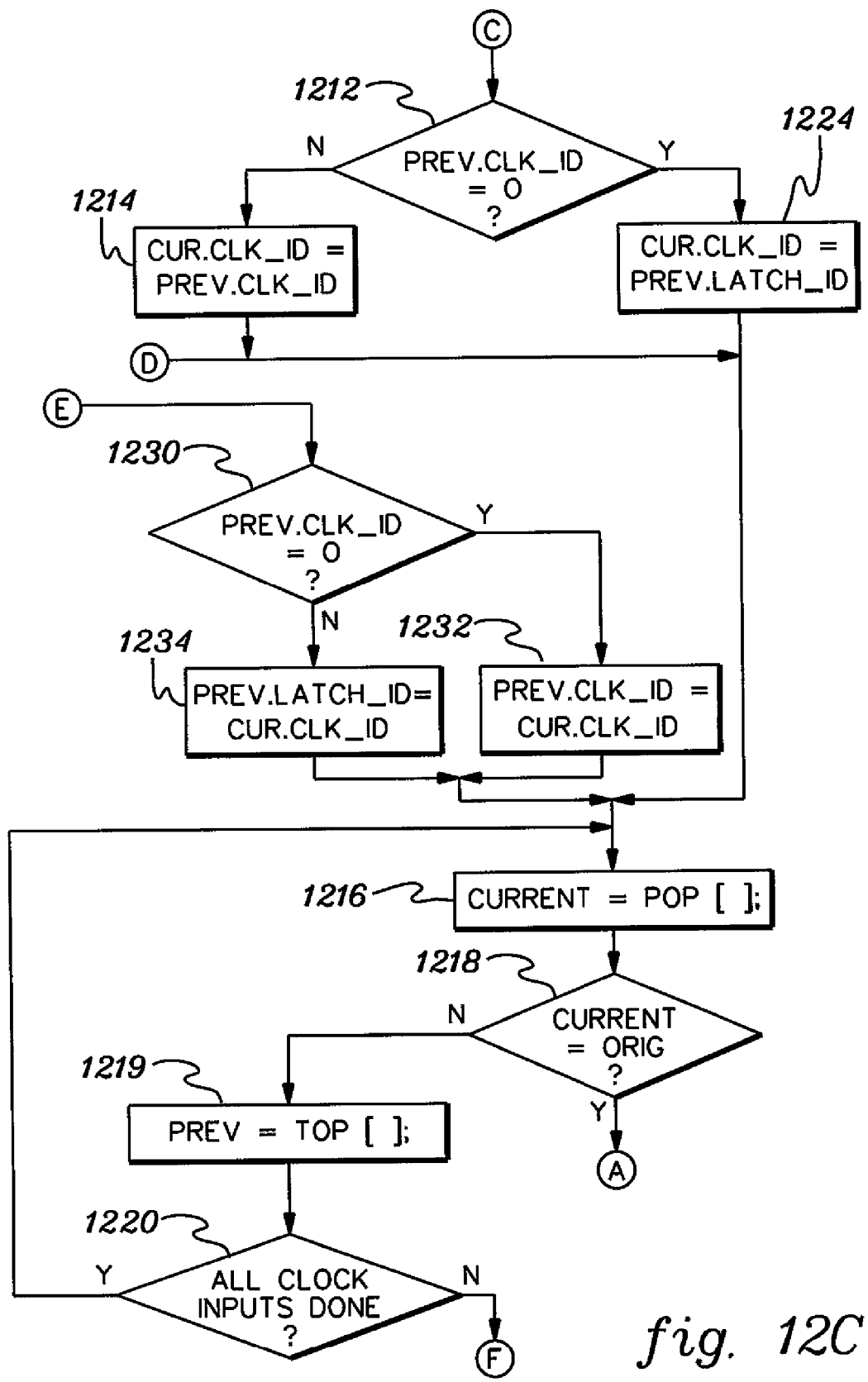
Figure 13:
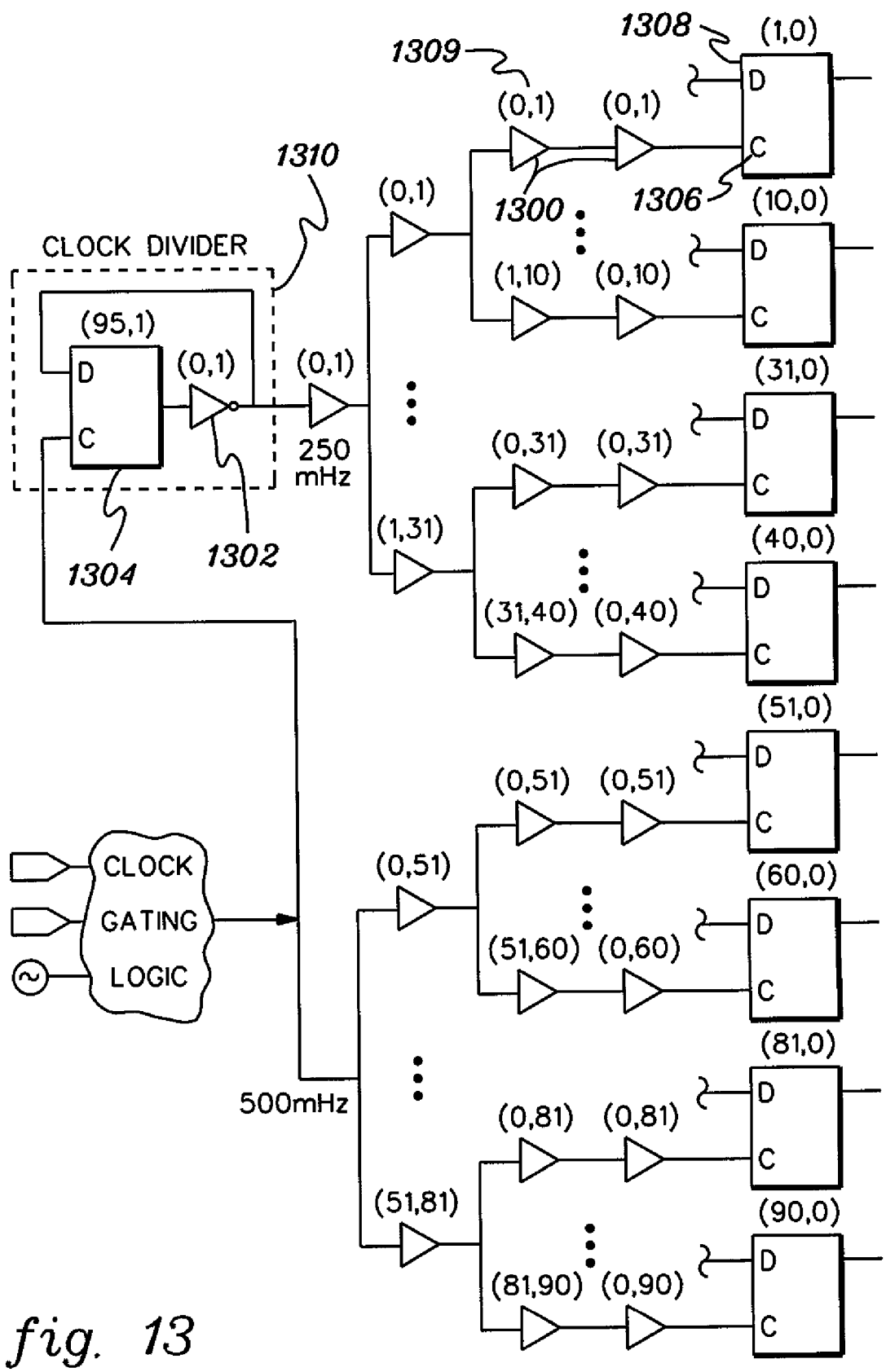
FIG. 13 is a pictorial illustration of clock and maintenance logic for a sample portion of a model, in accordance with an aspect of the present invention.
Figure 14:
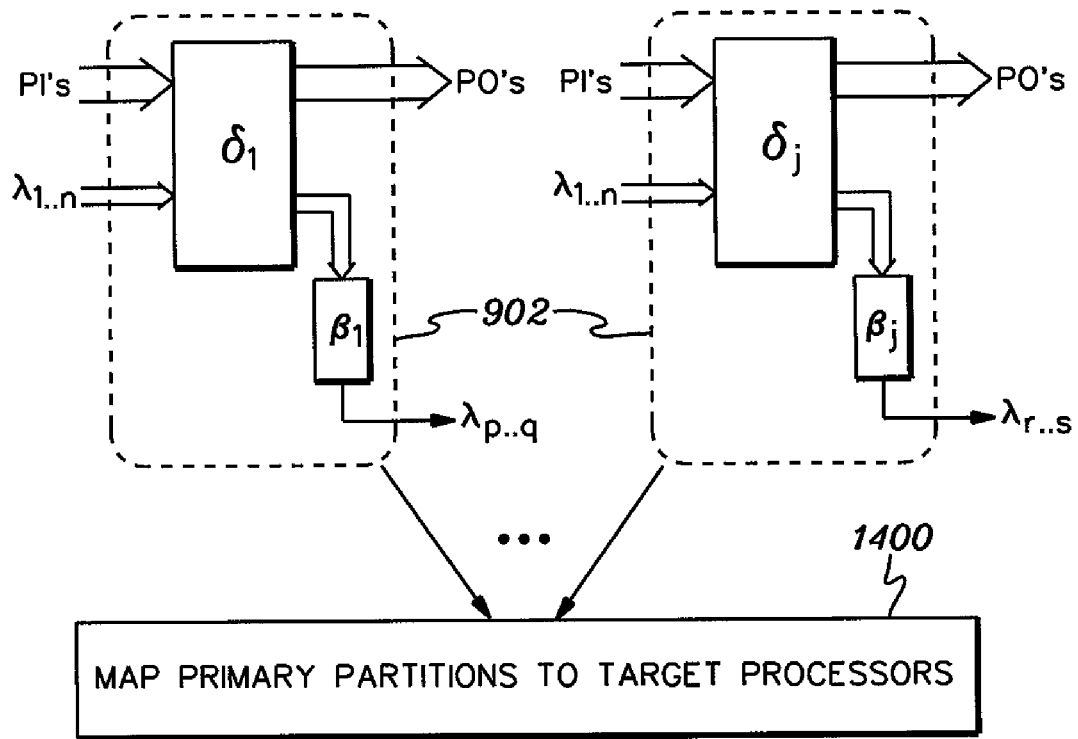
FIG. 14 is a pictorial illustration of the mapping of the primary partitions of FIG. 9 to target processors, in accordance with an aspect of the present invention.
Figure 14:
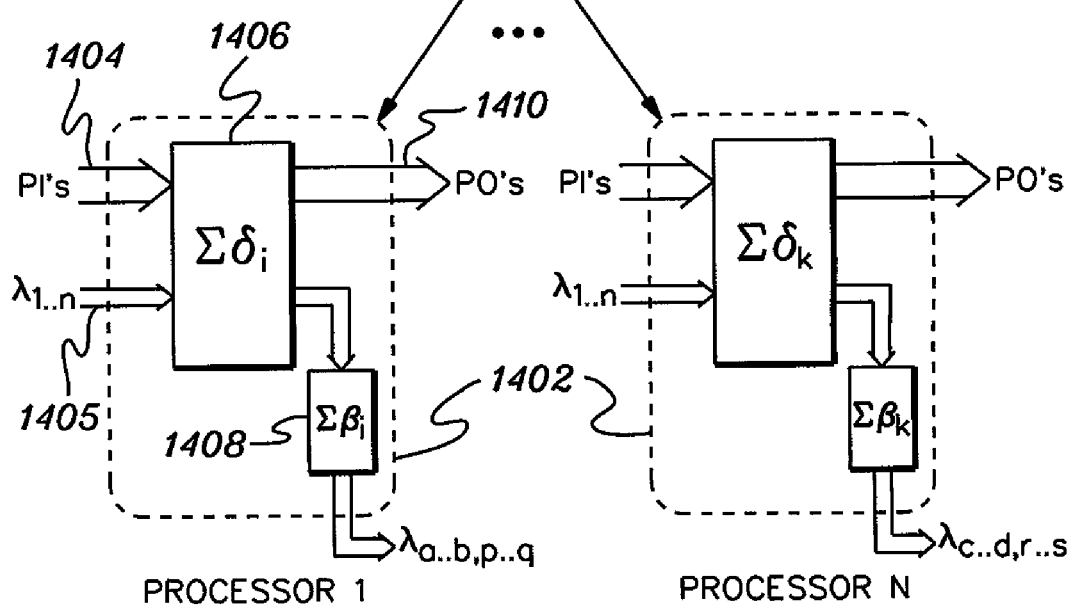

As depicted in FIG. 13, the clock and maintenance logic includes a plurality of components, such as, for instance, one or more buffers 1300, one or more inverters 1302, and/or one or more latches 1304, which are input to one or more clock pins 1306 of one or more latches 1308. Other components may also exist. In one embodiment, each component of the clock and maintenance logic has a tuple 1309 associated therewith. The tuple includes a LATCH_ID, CLK_ID pair determined from the partitioning processing. For instance, the LATCH_IDs are mostly provided from performing the logic of FIG. 6, although some of the values may be overridden by the processing of FIGS. 12a–12c; and the CLK_IDs are provided from performing the logic of FIGS. 12a–12c.

Referring to FIG. 12a, initially, a determination is made as to whether all of the latches of the chip have been processed, INQUIRY 1200. If all of the latches have not been processed, then a latch is selected from the output list previously provided, STEP 1202. Thereafter, a determination is made as to whether all of the clock inputs of the selected latch have been processed, INQUIRY 1204. If all of the clock inputs have been processed, then processing continues with INQUIRY 1200. However, if all of the clock inputs have not been processed, then a clock input is selected, STEP 1206. Additionally, a variable referred to as Orig is set equal to another variable referred to as Current, which initially represents the latch being processed; a variable Prev is set equal to Current; Current is pushed onto a stack; and Current is set equal to a variable referred to as Input, which initially represents the clock input being processed, STEP 1208.

Thereafter, processing continues with FIG. 12b, in which a determination is made as to whether Current is a latch, INQUIRY 1210. Should Current be a latch (such as with clock divider 1310 of FIG. 13), then a further determination is made as to whether PREV.CLK_ID is equal to zero, INQUIRY 1212 (FIG. 12c). If PREV.CLK_ID is not equal to zero, then CUR.CLK_ID is set equal to PREV.CLK_ID, STEP 1214. Otherwise, if PREV.CLK_ID is equal to zero indicating a latch to latch connection, then CUR.CLK_ID is set equal to PREV.LATCH_ID, STEP 1224.

Subsequent to setting CUR.CLK_ID, the stack is popped to obtain the previous Current, STEP 1216. Thereafter, a determination is made as to whether Current is equal to Orig, INQUIRY 1218. If Current is equal to Orig, then processing continues with INQUIRY 1204 (FIG. 12a). However, if Current is not equal to Orig, then Prev is set equal to data taken from the top of the stack (without popping the stack), STEP 1219.

Next, a determination is made as to whether all of the clock inputs have been processed, INQUIRY 1220. If all of the clock inputs have not been processed, then Current is set equal to the next Input, STEP 1222 (FIG. 12b), and processing continues with INQUIRY 1210. Otherwise, processing continues with STEP 1216 (FIG. 12c).

Returning to INQUIRY 1210 (FIG. 12b), if Current is not a latch, then a further determination is made as to whether Current is a primary input, INQUIRY 1226. If Current is a primary input, then processing continues with STEP 1216 (FIG. 12c), as described above. However, if Current is not a primary input, then a further determination is made as to whether CUR.CLK_ID is equal to zero, INQUIRY 1228 (FIG. 12b). If CUR.CLK_ID is not equal to zero, which implies that this clock logic is shared with other functional latches, then a further determination is made as to whether PREV.CLK_ID is equal to zero, INQUIRY 1230 (FIG. 12c). Should PREV.CLK_ID be equal to zero, typically indicating a latch, then PREV.CLK_ID is set equal to CUR.CLK_ID, STEP 1232. Otherwise, if PREV.CLK_ID is not equal to zero, indicating that one buffer is driving multiple latches, then PREV.LATCH_ID is set equal to CUR.CLK_ID, STEP 1234. After setting either PREV.LATCH_ID or PREV.CLK_ID, processing continues with STEP 1216.

Returning to INQUIRY 1228 (FIG. 12b), if CUR.CLK_ID is equal to zero, then combinatorial clock logic associated with the latch is to be identified. Thus, a further determination is made as to whether PREV.CLK_ID is equal to zero, INQUIRY 1236. If PREV.CLK_ID is equal to zero, then CUR.CLK_ID is set equal to PREV.LATCH_ID, STEP 1238. Otherwise, CUR.CLK_ID is set equal PREV.CLK_ID, STEP 1240, and CUR.LATCH_ID is set equal to zero to override the data value provided during the partitioning of the functional logic, STEP 1242.

After setting CUR.LATCH_ID and/or CUR.CLK_ID, Prev is set equal to Current, and Current is pushed onto the stack, STEP 1244. Further, Current is set equal to the next Input, STEP 1222, and processing continues with INQUIRY 1210.

As described herein, the partitioning of the chip produces one or more LATCH_ID, CLK_ID tuples for the chip. These tuples can be categorized into four types, which are summarized in the table below:

| TYPE | LATCH_ID ≠ 0 | CLK_ID ≠ 0 | PARTITION CHARACTERISTIC |
|---|---|---|---|
| 1 | No | No | Partitionable Independent Logic |
| 2 | Yes | No | Partition Specific Functional Logic |
| 3 | No | Yes | Partition Specific Clock/Maintenance Logic |
| 4 | Yes | Yes | Shared Clock/Maintenance |

The categorizing of the tuples into the various types is useful in the mapping of the clock and maintenance logic to the target processors, as described in further detail below.

Subsequent to determining the clock/maintenance logic associated with the primary partitions, the primary partitions are mapped using logic 1400 (FIG. 14) to a plurality of target processors 1402. Each target processor 1402 includes one or more primary inputs 1404; one or more inputs 1405 from one or more partitions of other processors; a linear combination of orthogonal combinatorial logic 1406; a linear combination of latches that bound the linear combination of orthogonal combinatorial logic 1408; and one or more primary outputs 1410.

The number of processors is an input to the technique, and thus, the technique can work with an arbitrary number of processors. Further, the mapping technique can include different policies, and these policies are independent of the chip design and/or the partitioning.

One embodiment of the logic associated with mapping the primary partitions to an arbitrarily chosen number of target processors is described with reference to FIG. 15. In this example, the mapping policy is based on equality, in which each processor is assigned a partition in order, until there are no more partitions. However, as stated herein, this is only one example. Any mapping policy may be used.

Figure 15:
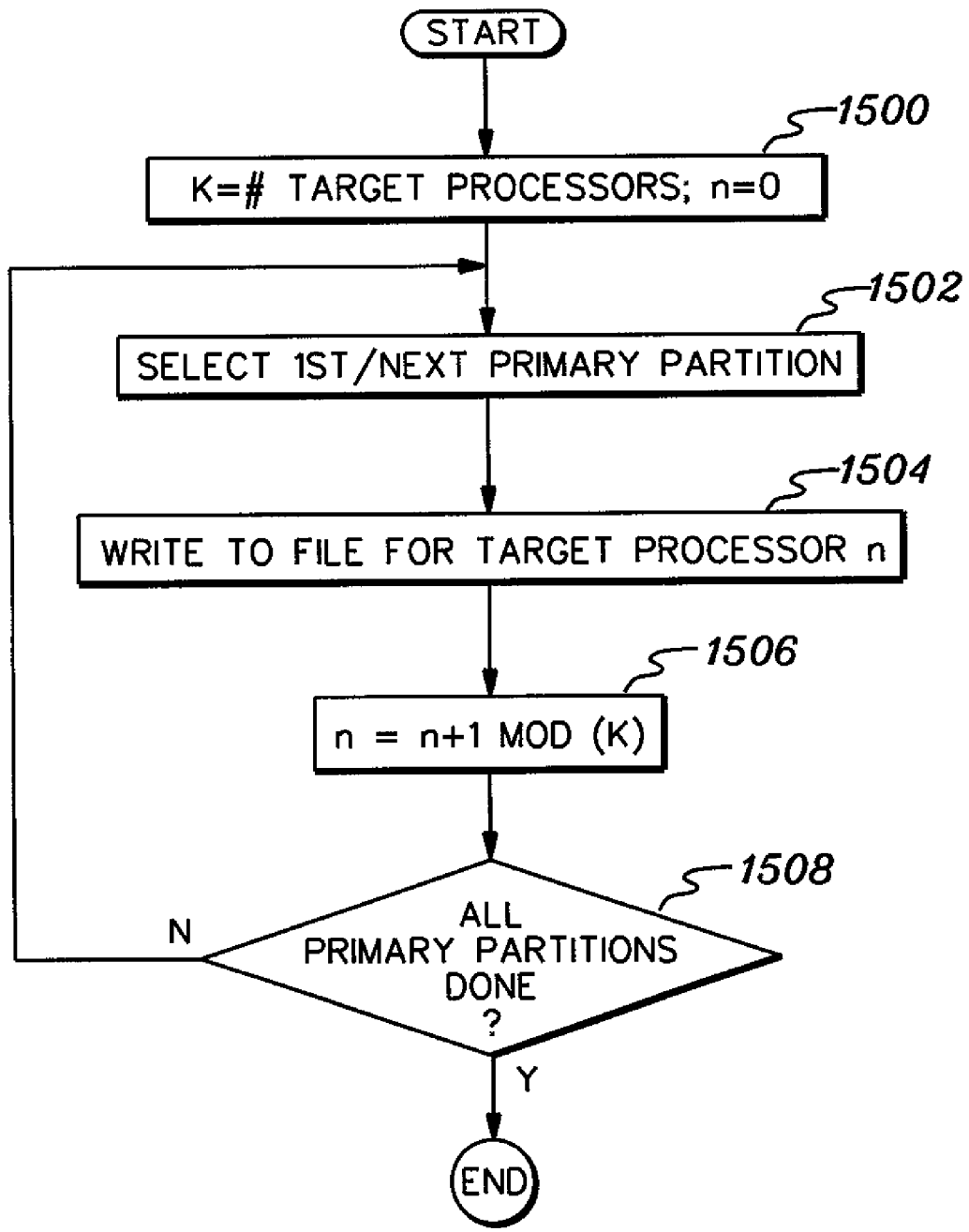
FIG. 15 depicts one embodiment of the logic associated with mapping the primary partitions to the target processors, in accordance with an aspect of the present invention.

Referring to FIG. 15, initially, a variable referred to as K is set to the desired number of target processors, and another variable, N, is set to zero, STEP 1500. Thereafter, a primary partition (e.g., the first partition) is selected, STEP 1502, and a write of the primary partition to a file for target processor N is performed, STEP 1504. Next, N is increased, STEP 1506. In one example, N is increased by a value of N+1 mod (K). Subsequently, a determination is made as to whether all of the primary partitions have been mapped to target processors, INQUIRY 1508. If not, then processing continues with STEP 1502. When all of the primary partitions have been mapped to the target processors, then the mapping logic is complete.

Figure 16:
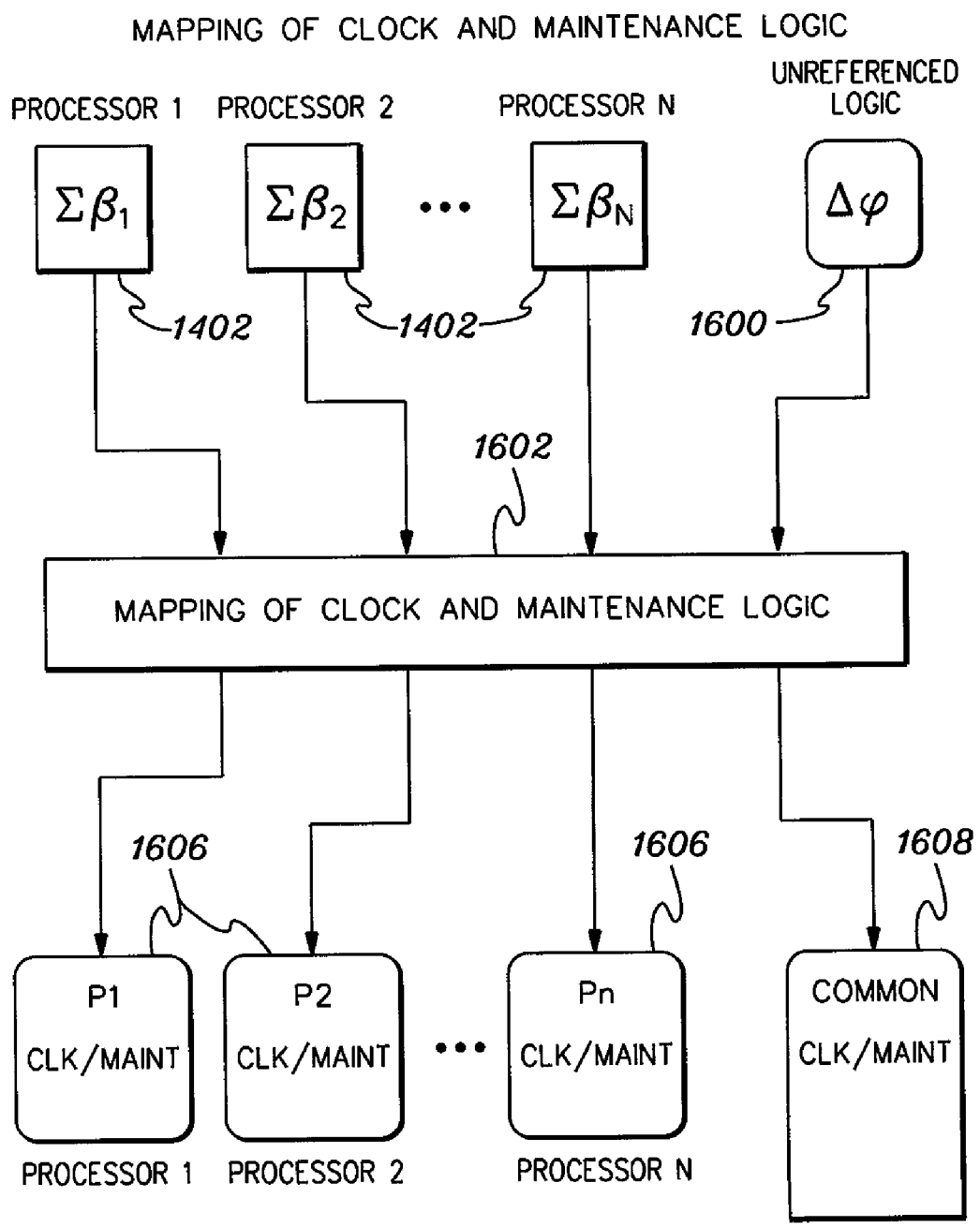
FIG. 16 is a pictorial illustration of the mapping of the clock and maintenance logic to the target processors, in accordance with an aspect of the present invention.

In addition to mapping the functional logic of a chip to the target processors, other logic, if any, such as the clock and maintenance logic, is also mapped. This is illustrated in FIG. 16, in which unreferenced logic 1600 is mapped using mapping clock and maintenance logic 1602. The output of the mapping of the clock and maintenance logic is the assigning of each of the one or more clock partitions 1606 to the target processor of its associated primary partition, and the distribution of the common set of clock and maintenance logic 1608 across all of the target processors.

One embodiment of the logic associated with mapping the clock and maintenance logic is described with reference to FIGS. 17a–17b. In one example, this logic is processed for each target processor.

Figure 17A:
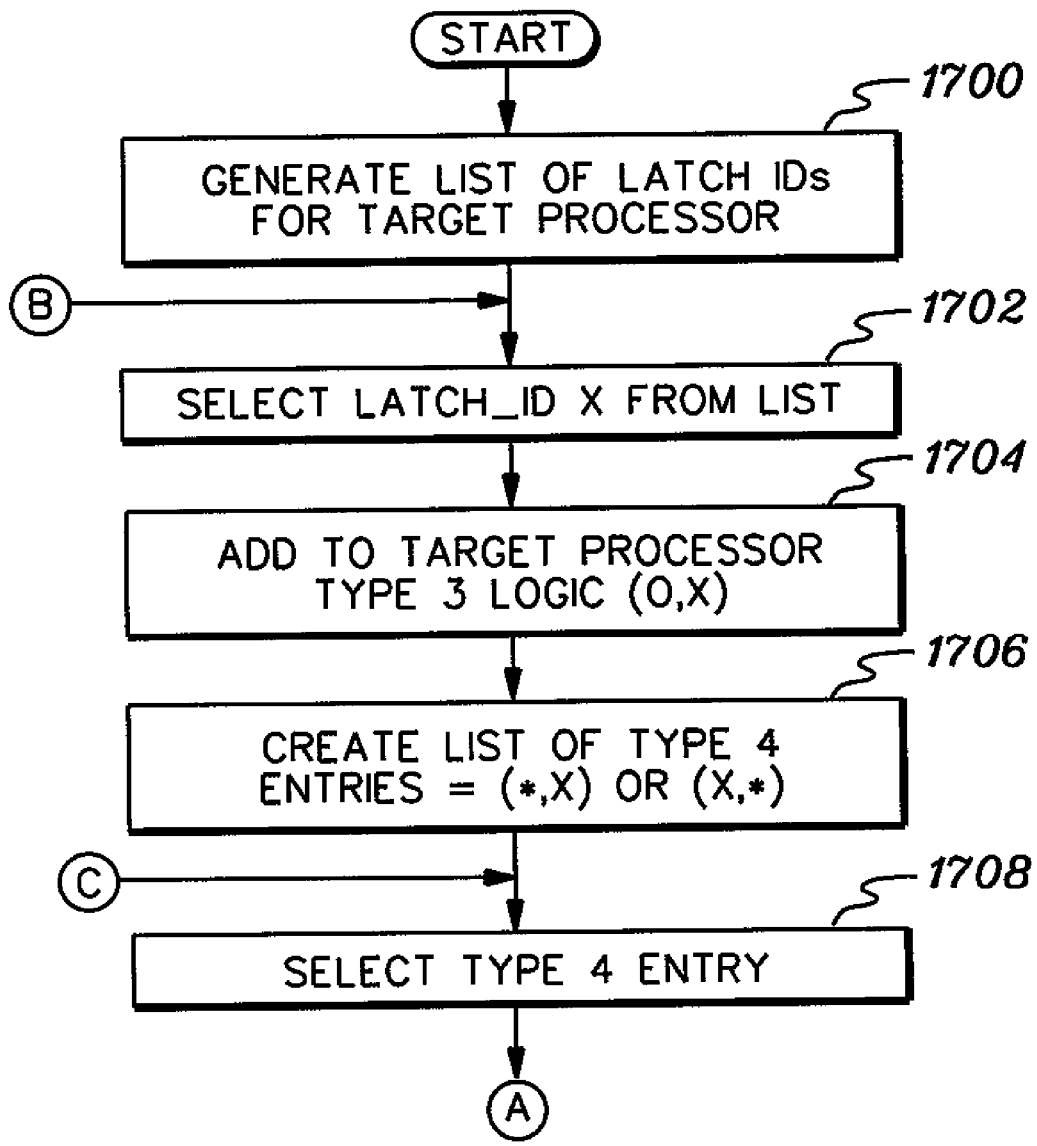
FIGS. 17a–17b depict one embodiment of the logic associated with mapping the clock and maintenance logic to the target processors, in accordance with an aspect of the present invention.
Figure 17B:
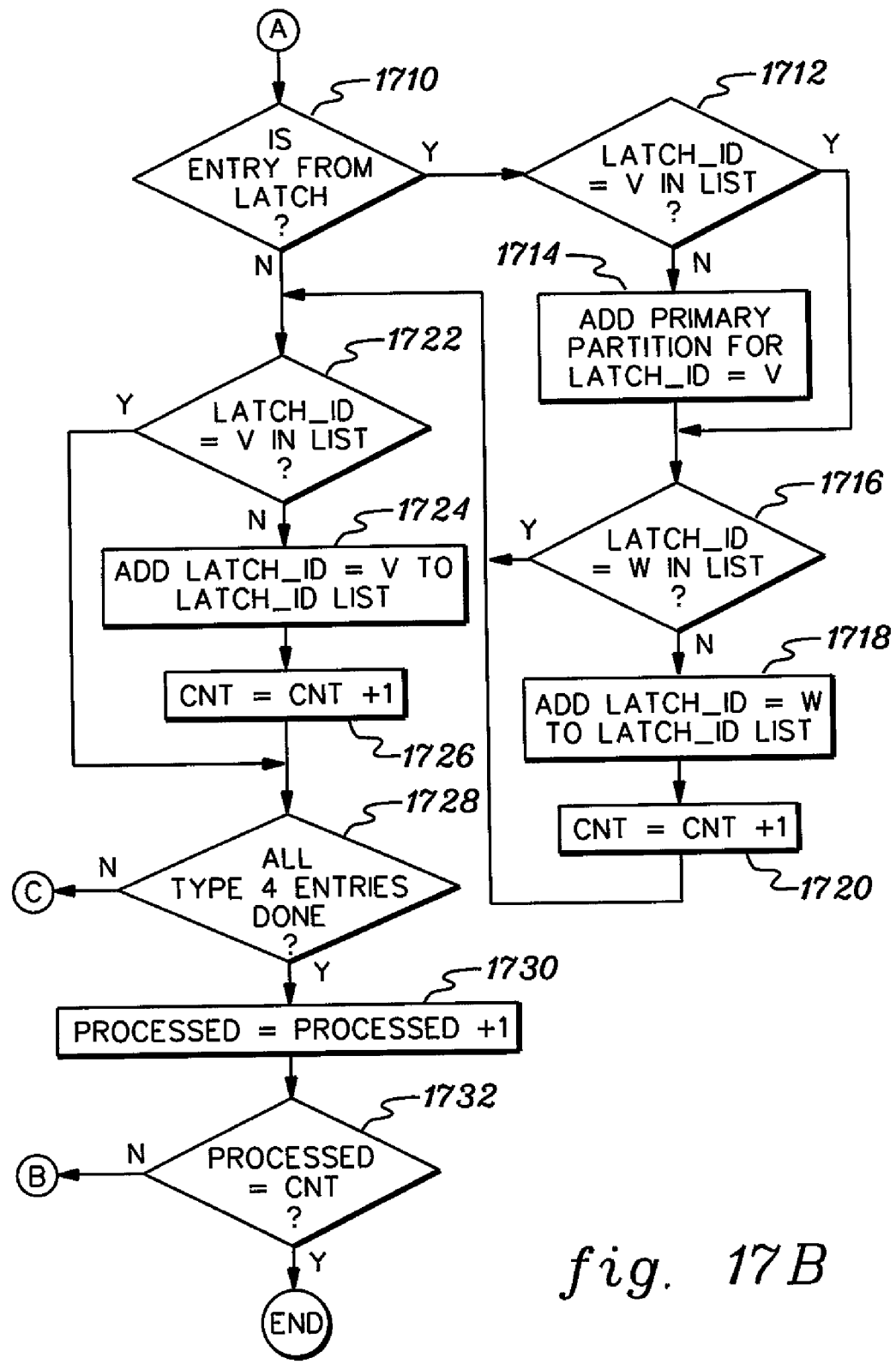
Figure 18:
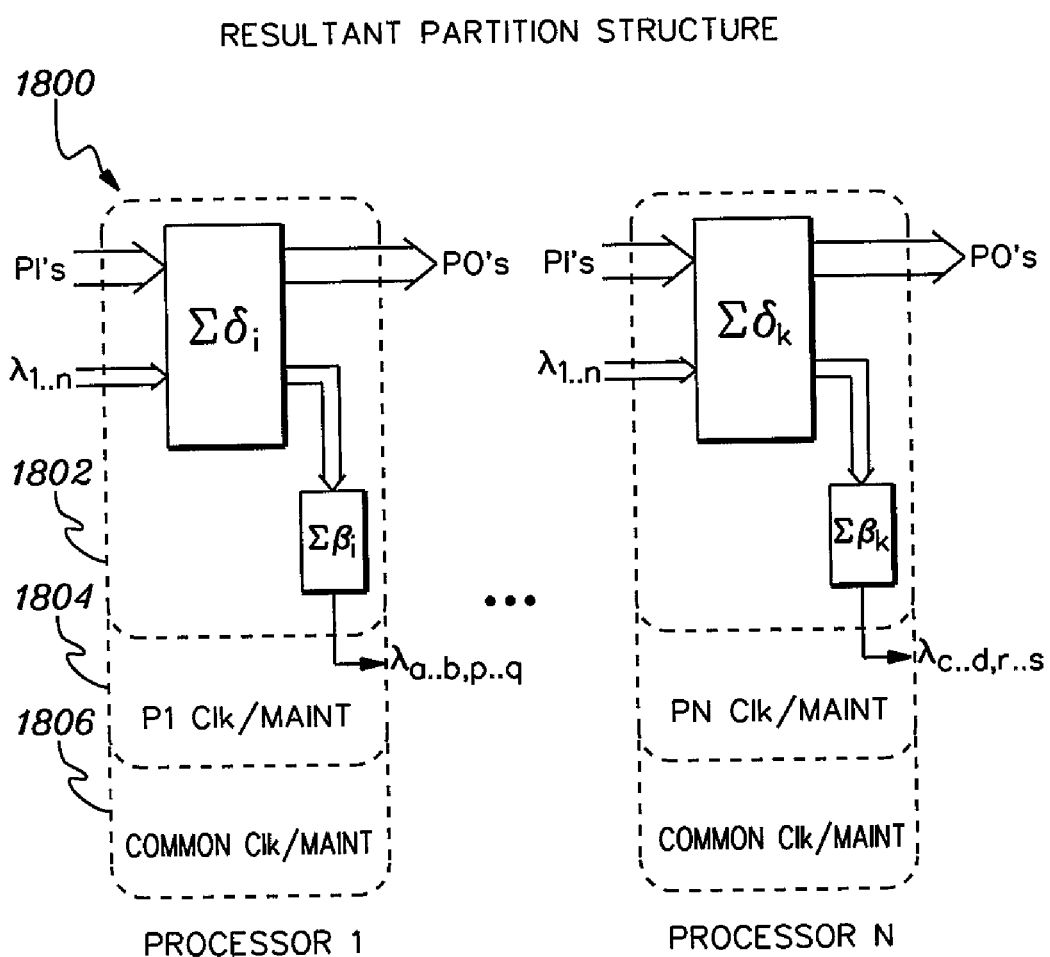
FIG. 18 is a pictorial illustration of the resultant partition structure partitioned in accordance with an aspect of the present invention.

Referring to FIG. 17a, initially, a list of latch ids for the selected target processor is generated, STEP 1700. This list is a composite list of LATCH_ID's from each primary partition that has been mapped to the target processor in STEP 406 of FIG. 4. Thereafter, a latch id (e.g., LATCH_ID X) is selected from the list to be processed, STEP 1702.

In processing LATCH_ID X, Type 3 logic (0, X) for the selected latch id is added to the target processor, STEP 1704. In one example, this includes writing the partition specific clock logic to the target processor. Additionally, a list of Type 4 entries (*, X) or (X, *) is created for that LATCH_ID, STEP 1706. Next, a Type 4 entry is selected, STEP 1708, and a determination is made as to whether the entry is from a latch, STEP 1710 (FIG. 17b). If the entry is from a latch, then a further determination is made as to whether the LATCH_ID is already in the target processor's LATCH_ID list, INQUIRY 1712. For instance, a determination is made as to whether LATCH_ID=V is in the list, where the tuple V,W represents LATCH_ID, CLK_ID of the Type 4 entry selected in STEP 1708. If LATCH_ID=V is not in the list, then the primary partition for LATCH_ID=V is added to the target processor's list, STEP 1714. This enables functional logic of latches that are driving clocks to be included in the mapping of clock/maintenance logic to the target processor.

Thereafter, or if LATCH_ID=V is in the list, then a further determination is made as to whether LATCH_ID=W is in the list, INQUIRY 1716. If LATCH_ID=W is not in the list, then LATCH_ID=W is added to the LATCH_ID list of the target processor, STEP 1718, and a variable referred to as CNT is incremented by one, STEP 1720.

Thereafter, or if LATCH_ID=W is in the list, a determination is made as to whether LATCH_ID=V is in the list, INQUIRY 1722. If LATCH_ID=V is not in the list, then LATCH_ID=V is added to the LATCH_ID list, STEP 1724, and CNT is incremented by one, STEP 1726. Subsequently, or if LATCH_ID=V is in the list, then a determination is made as to whether the Type 4 entries have been processed, INQUIRY 1728. If there remains Type 4 entries to be processed, then processing continues with STEP 1708. Otherwise, a variable referred to as Processed is incremented by one, STEP 1730.

Next, a determination is made as to whether Processed is equal to CNT, INQUIRY 1732. If Processed is not equal to CNT, then processing continues with STEP 1702. Otherwise, the clock/maintenance logic mapping for the selected target processor is complete.

Subsequent to assigning the clock partitions to the target processors, a target processor 1800 (FIG. 18) may include one or more primary partitions 1802 of the functional logic of the chip; a partition 1804 of the clock and maintenance logic, which is associated with the primary partitions; and common clock and maintenance logic 1806, which is common to all of the target processors. It will be understood that in some examples, a processor may not have one or more of the partitions, such as its own clock/maintenance partition.

Described in detail above is a partitioning capability that facilitates simulation of large or complex models within a distributed environment. The partitioning technique automatically constrains the I/O for each primary partition to the set of latches, PI's and PO's for the chip, of which only latch I/O's need communicate with a primary partition resident on another processor. These boundary characteristics of the resultant primary partition allow for a significant simplification of discrete event management across processors. Advantageously, this capability addresses performance degradation experienced with event simulation for large designs, such as System on Chip designs.

As described above, each target processor simultaneously processes a smaller set of events, corresponding to a subset of the ASIC chip, resulting in increased performance. A systematic technique is provided to partition arbitrary ASIC logic to run efficiently in a distributed event simulation environment; thereby, addressing both the time and space problem. The functional logic is initially partitioned into finely grained primary partitions that contain minimal dependencies. The primary partitions automatically reflect a minimal size, with a reduced set of dependencies. Then, the clock logic is analyzed to partition it according to its associated functional logic. Finally, the primary partitions are mapped to actual partitions that will run on a set of target computers that will implement a distributed event simulation environment. The partition mapping alternatives are more flexible due to the minimal dependencies between the primary partitions. Also, the problem of running a distributed simulation environment for a reasonable amount of time prior to synchronization is addressed by the technique.

The inputs to the technique are the ASIC logic to partition (e.g., VHDL or netlist), and the number of target computers in the distributed event simulation environment. The ASIC logic is synthesized into gates in order to assure clear functionality interpretations. The output from the technique is a set of partitioned ASIC logic files that map one to one onto a set of target computers in the distributed event simulation environment. Each step is summarized, as follows:

Functional Logic Partitioning:

The logic recursively traces back from the latch or chip outputs, through the combinatorial logic, until each path terminates at a latch or chip input. The combinatorial logic transversed in a recursive trace is included in a cone of logic. Each cone of logic is given a unique ID at the start of the trace, such that the logic gates encountered during the cone trace are given that ID. Upon encountering an existing ID on a logic gate in a subsequent cone trace, the original ID remains, and the associated cones are logically merged by correlating the intersecting ids in a separate merge list. Upon completion of the cone traces, the merge list includes a set of primary partitions, each partition including from 1 to N cones of logic. The technique effectively groups the logic into sets (primary partitions) that share any combinatorial logic, such that the primary partition's I/O are either latches or chip I/O. A latch boundary allows, for instance, for optimal conservative advancement of the global simulation time, by assuring that the combinatorial logic is encapsulated within a partition, such that time in a distributed environment can advance in increments of the latch cycle time prior to exchanging information. This time is usually much larger than the time before the next event would occur (maximum time one could advance conservatively with arbitrary partitioning.)

Clock Logic Partitioning:

The synchronous portions of the logic (e.g., latches) are driven by clock logic. Therefore, after functional logic partitioning is complete, a separate clock logic partitioning step will trace back clock inputs from each latch until all related clock logic is encountered. Each logic gate encountered during the trace includes a clock logic ID, which will typically be set with the ID of the latch that initiated the trace. If a logic gate is encountered that already has an ID due to a previous clock logic trace from another latch, the previous logic gate of the current trace is updated with the clock information of the already processed gate. This results in non-zero entries in both the LATCH_ID and CLK_ID field of a logic gate (Type 4 entry), which indicates that there is clock logic which is shared by multiple latches, and also terminates the trace for this path. Upon completion of the clock logic trace back, the clock support logic is correlated with the associated functional logic to the extent that unique clock logic is flagged along with shared logic such that clock dependencies can be taken into account in the final partitioning step.

Partition Mapping onto Target Processors:

The resulting number of primary partitions will be much greater than the number of target processors in most cases, due to the fact that the technique aggregates the logic based on combinatorial logic connections, which tend to be limited, due to the physical constraints and cycle time requirements (e.g., limited fan in and fan out). The small size, coupled with a high degree of independence, allows for aggregating the actual partitions in a balanced fashion. The clock partitioning step will have correlated the required clock support logic, such that unique clock logic is only associated with its primary partition, and shared clock logic will be replicated on each partition. The replication of shared clock logic assures that clocks behave the same in all partitions, such that an advancement in global simulation time will generate events, triggered by latch clocks, uniformly across partitions. Therefore, the mapping of partitions on processors will merely select primary partitions, whose functional and clock logic already have minimal dependencies, and distribute them across the target computers. This implementation does not preclude the option of running more than one partition on an SMP computer.

The present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of partitioning a model, said method comprising:
   automatically partitioning a model of an arbitrary size into a plurality of partitions to be distributed across an arbitrary number of processors;
   determining clock logic of the model common to multiple partitions of the plurality of partitions; and
   associating the common clock logic with the multiple partitions, wherein a partition of the plurality of partitions not sharing the clock logic is excluded from having the common clock logic associated therewith, and wherein the automatically partitioning, the determining and the associating are automatically performed without user directive.

2. The method of claim 1, further comprising assigning the plurality of partitions to the arbitrary number of processors.

3. The method of claim 2, wherein the assigning is based on a policy, said policy being independent of the partitioning.

4. The method of claim 1, wherein the model is to be simulated within a distributed environment, said distributed environment comprising said arbitrary number of processors.

5. The method of claim 4, wherein said model is to be simulated using event simulation.

6. The method of claim 1, wherein said automatically partitioning comprises:
   partitioning the model into multiple cones of logic; and
   combining the multiple cones of logic into the plurality of partitions.

7. The method of claim 1, wherein said model comprises functionality of a chip.

8. The method of claim 7, wherein the automatically partitioning comprises:
   partitioning the functionality of the chip into multiple logic units, each logic unit comprising a single latch of the chip; and
   combining the multiple logic units into the plurality of partitions, wherein each partition of the plurality of partitions comprises one or more logic units of the multiple logic units.

9. The method of claim 8, wherein said combining into a partition of the plurality of partitions comprises:
   determining whether a latch of one logic unit intersects with one or more latches of one or more other logic units; and
   including in said partition said one logic unit and any of said one or more other logic units determined to intersect with said one logic unit.

10. The method of claim 9, wherein the latch of the one logic unit intersects with the latch of another logic unit, when the latch of the one logic unit shares combinatorial logic with the latch of the another logic unit.

11. The method of claim 8, wherein the combining comprises:
   obtaining a list of intersecting latches, wherein said list includes a plurality of entries having a latch id and an intersecting latch id;
   determining whether zero or more latch ids are repeated one or more times in the list, wherein zero or more sets of multiple entries are provided, and wherein a set, if provided, comprises multiple entries having the same latch id;

for each set of multiple entries that is provided:
   removing from the list one or more multiple entries of the set, wherein one entry of the set remains in the list;
   providing in the list one or more latch ids that correspond to one or more intersecting latch ids of the set removed; and
   assigning the one or more latch ids provided in the list an intersecting latch id of the set;
   repeating said determining, said removing, said providing and said assigning, at least in response to at least one set of multiple entries being provided;
   reducing said list, in which there are no intersecting latch ids equal to latch ids; and
   using the reduced list in assigning the multiple logic units to the plurality of partitions.

12. The method of claim 11, wherein the one entry of the set to remain in the list is the entry with the lowest intersecting latch id of the set.

13. The method of claim 11, wherein the assigning of the intersecting latch id comprises the assigning of the intersecting latch id that is remaining in the list for that set.

14. The method of claim 11, wherein said reducing comprises:
   locating in the list one or more intersecting latch ids that have the same value as a latch id of the list;
   changing the one or more intersecting latch ids to the intersecting latch id corresponding to the latch id of the same value; and
   repeating the locating and changing zero or more times, until there are no intersecting latch ids equal to the latch ids.

15. The method of claim 7, further comprising:
   partitioning clock logic of the chip into multiple clock partitions; and
   assigning the multiple clock partitions to one or more processors of the arbitrary number of processors.

16. The method of claim 15, wherein a clock partition of the multiple clock partitions corresponds to a partition of the plurality of partitions, and wherein the assigning comprises assigning the clock partition and the partition to a same processor.

17. The method of claim 1, wherein a partition of the plurality of partitions is disjoint from the other partitions of the plurality of partitions.

18. The method of claim 1, further comprising partitioning other logic associated with said model into at least one of a plurality of logic partitions and a common set of logic to be assigned to at least a plurality of processors of said arbitrary number of processors.

19. The method of claim 18, wherein the common set of logic is assigned to each processor of the arbitrary number of processors.

20. The method of claim 18, wherein a logic partition of the plurality of logic partitions is associated with a partition of the plurality of partitions, and wherein the logic partition and the partition are assigned to a same processor of the arbitrary number of processors.

21. A method of partitioning a chip, said method comprising:
   partitioning functionality of a chip of an arbitrary size into multiple cones of logic:
   combining the multiple cones of logic into a plurality of partitions, wherein the plurality of partitions are provided without user directive;
   mapping the plurality of partitions to an arbitrary number of processors;
   partitioning, without user directive, clock logic of the chip into a plurality of clock partitions and a common set of clock logic, said common set of clock logic being common to multiple partitions of the plurality of partitions;
   assigning the plurality of clock partitions to the arbitrary number of processors; and
   associating, without user directive, the common set of clock logic with the multiple partitions, wherein a partition of the plurality of partitions not sharing the common set of clock logic is excluded from having the common set of clock logic associated therewith.

22. The method of claim 21, wherein the partitioning into a plurality of clock partitions comprises, for a clock partition, identifying clock logic uniquely associated with a latch of the chip, and wherein the assigning for the clock partition comprises writing the identified clock logic to the processor of the latch.

23. The method of claim 21, wherein the partitioning into a common set of clock logic comprises:
   determining whether clock logic of one or more latches of the chip intersects with clock logic of one or more other latches of the chip; and
   combining the intersecting logic to provide the common set of clock logic.

24. The method of claim 23, further comprising assigning the common set of clock logic to one or more processors of the arbitrary number of processors, wherein said assigning comprises writing the common set of clock logic to the one or more processors having partitions sharing the common set of clock logic.

25. The method of claim 21, further comprising partitioning other logic of the chip into at least one of a plurality of logic partitions and a common set of logic to be assigned to at least a plurality of processors of the arbitrary number of processors.

26. The method of claim 21, wherein each cone of logic comprises a latch of the chip, and wherein the combining comprises:
   obtaining a list of intersecting latches, wherein said list includes a plurality of entries having a latch id and an intersecting latch id;
   determining whether zero or more latch ids are repeated one or more times in the list, wherein zero or more sets of multiple entries are provided, and wherein a set, if provided, comprises multiple entries having the same latch id;
   for each set of multiple entries that is provided:
   removing from the list one or more multiple entries of the set, wherein one entry of the set remains in the list;
   providing in the list one or more latch ids that correspond to one or more intersecting latch ids of the set removed; and
   assigning the one or more latch ids provided in the list an intersecting latch id of the set;
   repeating said determining, said removing, said providing, and said assigning, at least in response to at least one set of multiple entries being provided;
   reducing said list, in which there are no intersecting latch ids equal to latch ids; and
   using the reduced list in assigning the multiple cones of logic to the plurality of partitions.

27. The method of claim 26, wherein said reducing comprises:
locating in the list one or more intersecting latch ids that have the same value as a latch id of the list;
changing the one or more intersecting latch ids to the intersecting latch id corresponding to the latch id of the same value; and
repeating the locating and changing zero or more times, until there are no intersecting latch ids equal to the latch ids.

28. The method of claim 21, wherein the mapping is based on a policy that is independent from the partitioning.

29. A system of partitioning a model, said system comprising:
means for automatically partitioning a model of an arbitrary size into a plurality of partitions to be distributed across an arbitrary number of processors;
means for determining clock logic of the model common to multiple partitions of the plurality of partitions; and
means for associating the common clock logic with the multiple partitions, wherein a partition of the plurality of partitions not sharing the clock logic is excluded from having the common clock logic associated therewith, and wherein the automatically partitioning, the determining and the associating are automatically performed without user directive.

30. The system of claim 29, further comprising means for assigning the plurality of partitions to the arbitrary number of processors.

31. The system of claim 30, wherein the assigning is based on a policy, said policy being independent of the partitioning.

32. The system of claim 29, wherein the model is to be simulated within a distributed environment, said distributed environment comprising said arbitrary number of processors.

33. The system of claim 32, wherein said model is to be simulated using event simulation.

34. The system of claim 29, wherein said means for automatically partitioning comprises:
means for partitioning the model into multiple cones of logic; and
means for combining the multiple cones of logic into the plurality of partitions.

35. The system of claim 29, wherein said model comprises functionality of a chip.

36. The system of claim 35, wherein the means for automatically partitioning comprises:
means for partitioning the functionality of the chip into multiple logic units, each logic unit comprising a single latch of the chip; and
means for combining the multiple logic units into the plurality of partitions, wherein each partition of the plurality of partitions comprises one or more logic units of the multiple logic units.

37. The system of claim 36, wherein said means for combining into a partition of the plurality of partitions comprises:
means for determining whether a latch of one logic unit intersects with one or more latches of one or more other logic units; and
means for including in said partition said one logic unit and any of said one or more other logic units determined to intersect with said one logic unit.

38. The system of claim 37, wherein the latch of the one logic unit intersects with the latch of another logic unit, when the latch of the one logic unit shares combinatorial logic with the latch of the another logic unit.

39. The system of claim 36, wherein the means for combining comprises:
means for obtaining a list of intersecting latches, wherein said list includes a plurality of entries having a latch id and an intersecting latch id;
means for determining whether zero or more latch ids are repeated one or more times in the list, wherein zero or more sets of multiple entries are provided, and wherein a set, if provided, comprises multiple entries having the same latch id;
means for performing for each set of multiple entries that is provided:
removing from the list one or more multiple entries of the set, wherein one entry of the set remains in the list;
providing in the list one or more latch ids that correspond to one or more intersecting latch ids of the set removed; and
assigning the one or more latch ids provided in the list an intersecting latch id of the set;
means for repeating the determining and the performing, at least in response to at least one set of multiple entries being provided;
means for reducing said list, in which there are no intersecting latch ids equal to latch ids; and
means for using the reduced list in assigning the multiple logic units to the plurality of partitions.

40. The system of claim 39, wherein the one entry of the set to remain in the list is the entry with the lowest intersecting latch id of the set.

41. The system of claim 39, wherein the assigning of the intersecting latch id comprises the assigning of the intersecting latch id that is remaining in the list for that set.

42. The system of claim 39, wherein said means for reducing comprises:
means for locating in the list one or more intersecting latch ids that have the same value as a latch id of the list;
means for changing the one or more intersecting latch ids to the intersecting latch id corresponding to the latch id of the same value; and
means for repeating the locating and changing zero or more times, until there are no intersecting latch ids equal to the latch ids.

43. The system of claim 35, further comprising:
means for partitioning clock logic of the chip into multiple clock partitions; and
means for assigning the multiple clock partitions to one or more processors of the arbitrary number of processors.

44. The system of claim 43, wherein a clock partition of the multiple clock partitions corresponds to a partition of the plurality of partitions, and wherein the means for assigning comprises means for assigning the clock partition and the partition to a same processor.

45. The system of claim 29, wherein a partition of the plurality of partitions is disjoint from the other partitions of the plurality of partitions.

46. The system of claim 29, further comprising means for partitioning other logic associated with said model into at least one of a plurality of logic partitions and a common set of logic to be assigned to at least a plurality of processors of said arbitrary number of processors.

47. The system of claim 46, wherein the common set of logic is assigned to each processor of the arbitrary number of processors.

48. The system of claim 46, wherein a logic partition of the plurality of logic partitions is associated with a partition of the plurality of partitions, and wherein the logic partition and the partition are assigned to a same processor of the arbitrary number of processors.

49. A system of partitioning a chip, said system comprising:
- means for partitioning functionality of a chip of an arbitrary size into multiple cones of logic;
- means for combining the multiple cones of logic into a plurality of partitions, wherein the plurality of partitions are provided without user directive;
- means for mapping the plurality of partitions to an arbitrary number of processors;
- means for partitioning, without user directive, clock logic of the chip into a plurality of clock partitions and a common set of clock logic, said common set of clock logic being common to multiple partitions of the plurality of partitions;
- means for assigning the plurality of clock partitions to the arbitrary number of processors; and
- means for associating, without user directive, the common set of clock logic with the multiple partitions, wherein a partition of the plurality of partitions not sharing the common set of clock logic is excluded from having the common set of clock logic associated therewith.

50. The system of claim 49, wherein the means for partitioning into a plurality of clock partitions comprises, for a clock partition, means for identifying clock logic uniquely associated with a latch of the chip, and wherein the means for assigning for the clock partition comprises means for writing the identified clock logic to the processor of the latch.

51. The system of claim 49, wherein the means for partitioning into a common set of clock logic comprises:
- means for determining whether clock logic of one or more latches of the chip intersects with clock logic of one or more other latches of the chip; and
- means for combining the intersecting logic to provide the common set of clock logic.

52. The system of claim 51, further comprising means for assigning the common set of clock logic to one or more processors of the arbitrary number of processors, wherein said means for assigning comprises means for writing the common set of clock logic to the one or more processors having partitions sharing the common set of clock logic.

53. The system of claim 49, further comprising means for partitioning other logic of the chip into at least one of a plurality of logic partitions and a common set of logic to be assigned to at least a plurality of processors of the arbitrary number of processors.

54. The system of claim 49, wherein each cone of logic comprises a latch of the chip, and wherein the means for combining comprises:
- means for obtaining a list of intersecting latches, wherein said list includes a plurality of entries having a latch id and an intersecting latch id;
- means for determining whether zero or more latch ids are repeated one or more times in the list, wherein zero or more sets of multiple entries are provided, and wherein a set, if provided, comprises multiple entries having the same latch id;
- means for performing for each set of multiple entries that is provided:
  - removing from the list one or more multiple entries of the set, wherein one entry of the set remains in the list;
  - providing in the list one or more latch ids that correspond to one or more intersecting latch ids of the set removed; and
  - assigning the one or more latch ids provided in the list an intersecting latch id of the set;
- means for repeating the determining and the performing, at least in response to at least one set of multiple entries being provided;
- means for reducing said list, in which there are no intersecting latch ids equal to latch ids; and
- means for using the reduced list in assigning the multiple cones of logic to the plurality of partitions.

55. The system of claim 54, wherein said means for reducing comprises:
- means for locating in the list one or more intersecting latch ids that have the same value as a latch id of the list;
- means for changing the one or more intersecting latch ids to the intersecting latch id corresponding to the latch id of the same value; and
- means for repeating the locating and changing zero or more times, until there are no intersecting latch ids equal to the latch ids.

56. The system of claim 49, wherein the mapping is based on a policy that is independent from the partitioning.

57. A system of partitioning a model, said system comprising:
- at least one processor to automatically partition a model of an arbitrary size into a plurality of partitions to be distributed across an arbitrary number of processors, to determine clock logic of the model common to multiple partitions of the plurality of partition, and to associate the common clock logic with the multiple partitions, wherein a partition of the plurality of partitions not sharing the clock logic is excluded from having the common clock logic associated therewith, and wherein the automatically partitioning, the determining and the associating are automatically performed without user directive.

58. A system of partitioning a chip, said system comprising:
- at least one processor to partition functionality of a chip of an arbitrary size into multiple cones of logic, to combine the multiple cones of logic into a plurality of partitions, wherein the plurality of partitions are provided without user directive, to map the plurality of partitions to an arbitrary number of processors, to partition, without user directive, clock logic of the chip into a plurality of clock partitions and a common set of clock logic, said common set of clock logic being common to multiple partitions of the plurality of partitions, to assign the plurality of clock partitions to the arbitrary number of processors, and to associate without user directive, the common set of clock logic with the multiple partitions, wherein a partition of the plurality of partitions not sharing the common set of clock logic is excluded from having the common set of clock logic associated therewith.

59. At least one program storage device readable by a machine tangibly embodying at least one program of instructions executable by the machine to perform a method of partitioning a model, said method comprising:
- automatically partitioning a model of an arbitrary size into a plurality of partitions to be distributed across an arbitrary number of processors;
- determining clock logic of the model common to multiple partitions of the plurality of partitions; and associating the common clock logic with the multiple partitions, wherein a partition of the plurality of partitions not sharing the clock logic is excluded from having the common clock logic associated therewith, and wherein the automatically partitioning, the determining and the associating are automatically performed without user directive.

60. The at least one program storage device of claim 59, wherein said method further comprises assigning the plurality of partitions to the arbitrary number of processors.

61. The at least one program storage device of claim 60, wherein the assigning is based on a policy, said policy being independent of the partitioning.

62. The at least one program storage device of claim 59, wherein the model is to be simulated within a distributed environment, said distributed environment comprising said arbitrary number of processors.

63. The at least one program storage device of claim 62, wherein said model is to be simulated using event simulation.

64. The at least one program storage device of claim 59, wherein said automatically partitioning comprises:
    partitioning the model into multiple cones of logic; and
    combining the multiple cones of logic into the plurality of partitions.

65. The at least one program storage device of claim 59, wherein said model comprises functionality of a chip.

66. The at least one program storage device of claim 65, wherein the automatically partitioning comprises:
    partitioning the functionality of the chip into multiple logic units, each logic unit comprising a single latch of the chip; and
    combining the multiple logic units into the plurality of partitions, wherein each partition of the plurality of partitions comprises one or more logic units of the multiple logic units.

67. The at least one program storage device of claim 66, wherein said combining into a partition of the plurality of partitions comprises:
    determining whether a latch of one logic unit intersects with one or more latches of one or more other logic units; and
    including in said partition said one logic unit and any of said one or more other logic units determined to intersect with said one logic unit.

68. The at least one program storage device of claim 67, wherein the latch of the one logic unit intersects with the latch of another logic unit, when the latch of the one logic unit shares combinatorial logic with the latch of the another logic unit.

69. The at least one program storage device of claim 66, wherein the combining comprises:
    obtaining a list of intersecting latches, wherein said list includes a plurality of entries having a latch id and an intersecting latch id;
    determining whether zero or more latch ids are repeated one or more times in the list, wherein zero or more sets of multiple entries are provided, and wherein a set, if provided, comprises multiple entries having the same latch id;
    for each set of multiple entries that is provided:
        removing from the list one or more multiple entries of the set, wherein one entry of the set remains in the list;
        providing in the list one or more latch ids that correspond to one or more intersecting latch ids of the set removed; and
        assigning the one or more latch ids provided in the list an intersecting latch id of the set;
    repeating said determining, said removing, said providing and said assigning, at least in response to at least one set of multiple entries being provided;
    reducing said list, in which there are no intersecting latch ids equal to latch ids; and
    using the reduced list in assigning the multiple logic units to the plurality of partitions.

70. The at least one program storage device of claim 69, wherein the one entry of the set to remain in the list is the entry with the lowest intersecting latch id of the set.

71. The at least one program storage device of claim 69, wherein the assigning of the intersecting latch id comprises the assigning of the intersecting latch id that is remaining in the list for that set.

72. The at least one program storage device of claim 69, wherein said reducing comprises:
    locating in the list one or more intersecting latch ids that have the same value as a latch id of the list;
    changing the one or more intersecting latch ids to the intersecting latch id corresponding to the latch id of the same value; and
    repeating the locating and changing zero or more times, until there are no intersecting latch ids equal to the latch ids.

73. The at least one program storage device of claim 65, wherein said method further comprises:
    partitioning clock logic of the chip into multiple clock partitions; and
    assigning the multiple clock partitions to one or more processors of the arbitrary number of processors.

74. The at least one program storage device of claim 73, wherein a clock partition of the multiple clock partitions corresponds to a partition of the plurality of partitions, and wherein the assigning comprises assigning the clock partition and the partition to a same processor.

75. The at least one program storage device of claim 59, wherein a partition of the plurality of partitions is disjoint from the other partitions of the plurality of partitions.

76. The at least one program storage device of claim 59, wherein said method further comprises partitioning other logic associated with said model into at least one of a plurality of logic partitions and a common set of logic to be assigned to at least a plurality of processors of said arbitrary number of processors.

77. The at least one program storage device of claim 76, wherein the common set of logic is assigned to each processor of the arbitrary number of processors.

78. The at least one program storage device of claim 76, wherein a logic partition of the plurality of logic partitions is associated with a partition of the plurality of partitions, and wherein the logic partition and the partition are assigned to a same processor of the arbitrary number of processors.

79. At least one program storage device readable by a machine tangibly embodying at least one program of instructions executable by the machine to perform a method of partitioning a chip, said method comprising:
    partitioning functionality of a chip of an arbitrary size into multiple cones of logic;
    combining the multiple cones of logic into a plurality of partitions, wherein the plurality of partitions are provided without user directive;
    mapping the plurality of partitions to an arbitrary number of processors;
    partitioning, without user directive, clock logic, of the chip into a plurality of clock partitions and a common set of clock logic, said common set of clock logic being common to multiple partitions of the plurality of partitions;

assigning the plurality of clock partitions to the arbitrary number of processors; and associating, without user directive, the common set of clock logic with the multiple partitions, wherein a partition of the plurality of partitions not sharing the common set of clock logic is excluded from having the common set of clock logic associated therewith.

80. The at least one program storage device of claim 79, wherein the partitioning into a plurality of clock partitions comprises, for a clock partition, identifying clock logic uniquely associated with a latch of the chip, and wherein the assigning for the clock partition comprises writing the identified clock logic to the processor of the latch.

81. The at least one program storage device of claim 79, wherein the partitioning into a common set of clock logic comprises:

determining whether clock logic of one or more latches of the chip intersects with clock logic of one or more other latches of the chip; and combining the intersecting logic to provide the common set of clock logic.

82. The at least one program storage device of claim 81, wherein the method further comprises assigning the common set of clock logic to one or more processors of the arbitrary number of processors, wherein said assigning comprises writing the common set of clock logic to the one or more processors having partitions sharing the common set of clock logic.

83. The at least one program storage device of claim 79, wherein said method further comprises partitioning other logic of the chip into at least one of a plurality of logic partitions and a common set of logic to be assigned to at least a plurality of processors of the arbitrary number of processors.

84. The at least one program storage device of claim 79, wherein each cone of logic comprises a latch of the chip, and wherein the combining comprises:

obtaining a list of intersecting latches, wherein said list includes a plurality of entries having a latch id and an intersecting latch id;

determining whether zero or more latch ids are repeated one or more times in the list, wherein zero or more sets of multiple entries are provided, and wherein a set, if provided, comprises multiple entries having the same latch id;

for each set of multiple entries that is provided:

removing from the list one or more multiple entries of the set, wherein one entry of the set remains in the list;

providing in the list one or more latch ids that correspond to one or more intersecting latch ids of the set removed; and assigning the one or more latch ids provided in the list an intersecting latch id of the set;

repeating said determining, said removing, said providing, and said assigning, at least in response to at least one set of multiple entries being provided;

reducing said list, in which there are no intersecting latch ids equal to latch ids; and using the reduced list in assigning the multiple cones of logic to the plurality of partitions.

85. The at least one program storage device of claim 84, wherein said reducing comprises:

locating in the list one or more intersecting latch ids that have the same value as a latch id of the list;

changing the one or more intersecting latch ids to the intersecting latch id corresponding to the latch id of the same value; and repeating the locating and changing zero or more times, until there are no intersecting latch ids equal to the latch ids.

86. The at least one program storage device of claim 79, wherein the mapping is based on a policy that is independent from the partitioning.

* * * * *